United States Patent
Lin et al.

(10) Patent No.: US 12,183,724 B2
(45) Date of Patent: Dec. 31, 2024

(54) MULTIPLE PIXEL PACKAGE STRUCTURE WITH BURIED CHIP AND ELECTRONIC DEVICE USING THE SAME

(71) Applicants: LITE-ON OPTO TECHNOLOGY (CHANGZHOU) CO., LTD., Changzhou (CN); LITE-ON TECHNOLOGY CORPORATION, Taipei (TW)

(72) Inventors: Chen-Hsiu Lin, New Taipei (TW); Tsung-Kang Ying, New Taipei (TW); Erh-Chan Hsu, Tainan (TW)

(73) Assignees: LITE-ON OPTO TECHNOLOGY (CHANGZHOU) CO., LTD., Changzhou (CN); LITE-ON TECHNOLOGY CORPORATION, Taipei (TW)

( * ) Notice: Subject to any disclaimer, the term of this patent is extended or adjusted under 35 U.S.C. 154(b) by 857 days.

(21) Appl. No.: 17/323,012

(22) Filed: May 18, 2021

(65) Prior Publication Data
US 2021/0272945 A1    Sep. 2, 2021

Related U.S. Application Data

(63) Continuation-in-part of application No. 16/898,617, filed on Jun. 11, 2020, now Pat. No. 11,296,064.
(Continued)

(30) Foreign Application Priority Data

Apr. 20, 2020 (CN) .......................... 202010313649.4
Dec. 1, 2020 (CN) .......................... 202022847064.9

(51) Int. Cl.
*H01L 29/18* (2006.01)
*H01L 21/56* (2006.01)
(Continued)

(52) U.S. Cl.
CPC .......... *H01L 25/167* (2013.01); *H01L 21/568* (2013.01); *H01L 23/13* (2013.01);
(Continued)

(58) Field of Classification Search
CPC ..... H01L 23/50; H01L 24/24; H01L 23/5389; H01L 23/49822; H01L 24/82;
(Continued)

(56) References Cited

U.S. PATENT DOCUMENTS 9,418,931 B2   8/2016  Chen
9,589,942 B2   3/2017  Chen
(Continued)

FOREIGN PATENT DOCUMENTS

CN    101038886 A    9/2007
CN    102789991 A    11/2012
(Continued)

*Primary Examiner* — Ismail A Muse
(74) *Attorney, Agent, or Firm* — Li & Cai Intellectual Property (USA) Office

(57) ABSTRACT

A multiple pixel package structure with a buried chip and an electronic device using the same are provided. The multiple pixel package structure includes a multi-layered circuit board, a plurality of pixels, a protective layer, and a control chip. The pixels are arranged on the multi-layered circuit board and into an array. Each of the pixels includes a plurality of light emitting elements of different colors. The protective layer is formed on the multi-layered circuit board and covers the pixels. The control chip is buried in the multi-layered circuit board and electrically connected to the light emitting elements of each of the pixels, so as to allow each of the pixels to produce a target luminous characteristic.

12 Claims, 30 Drawing Sheets

Related U.S. Application Data

(60) Provisional application No. 62/860,883, filed on Jun. 13, 2019.

(51) Int. Cl.
| | |
|---|---|
| *H01L 23/00* | (2006.01) |
| *H01L 23/13* | (2006.01) |
| *H01L 23/498* | (2006.01) |
| *H01L 25/16* | (2023.01) |
| *H01L 29/20* | (2006.01) |
| *H01L 33/00* | (2010.01) |
| *H01L 33/62* | (2010.01) |

(52) U.S. Cl.
CPC .. *H01L 23/49827* (2013.01); *H01L 23/49838* (2013.01); *H01L 24/05* (2013.01); *H01L 24/06* (2013.01); *H01L 24/24* (2013.01); *H01L 24/25* (2013.01); *H01L 24/08* (2013.01); *H01L 24/48* (2013.01); *H01L 33/62* (2013.01); *H01L 2224/05569* (2013.01); *H01L 2224/06051* (2013.01); *H01L 2224/08145* (2013.01); *H01L 2224/24101* (2013.01); *H01L 2224/24155* (2013.01); *H01L 2224/25171* (2013.01); *H01L 2224/48145* (2013.01); *H01L 2924/12041* (2013.01)

(58) Field of Classification Search
CPC ....... H01L 21/4857; H01L 2924/15311; H01L 2224/92; H01L 2924/19041; H01L 2224/24226; H01L 2224/73267; H01L 2924/1517; H01L 2224/92244; H01L 2924/01029; H01L 2924/15153; H01L 25/0657; H01L 2224/16; H01L 2924/01078; H01L 2924/01079; H01L 2924/01011; H01L 2924/01033; H01L 2924/01006; H01L 2924/014; H01L 2225/1035; H01L 2224/32225; H01L 2224/04105; H01L 2224/16235; H01L 2224/0401; H05K 1/185; H05K 3/4644

See application file for complete search history.

(56) References Cited

U.S. PATENT DOCUMENTS

| | | | |
|---|---|---|---|
| 2012/0293977 A1 | 11/2012 | Sun | |
| 2014/0317907 A1 | 10/2014 | Sun | |
| 2019/0096864 A1* | 3/2019 | Huitema | H01L 24/24 |
| 2019/0280163 A1 | 9/2019 | Li et al. | |
| 2020/0075564 A1* | 3/2020 | Lin | H01L 24/83 |
| 2020/0312904 A1* | 10/2020 | Hin | H01L 33/62 |
| 2020/0357749 A1* | 11/2020 | Chen | H01L 23/13 |
| 2020/0357750 A1 | 11/2020 | Chen et al. | |
| 2020/0358163 A1 | 11/2020 | See et al. | |
| 2020/0395304 A1 | 12/2020 | Chen et al. | |
| 2020/0395305 A1 | 12/2020 | Chen et al. | |
| 2020/0395306 A1 | 12/2020 | Chen et al. | |

FOREIGN PATENT DOCUMENTS

| | | |
|---|---|---|
| CN | 105990157 A | 10/2016 |
| CN | 105990159 A | 10/2016 |

\* cited by examiner

MULTIPLE PIXEL PACKAGE STRUCTURE WITH BURIED CHIP AND ELECTRONIC DEVICE USING THE SAME

CROSS-REFERENCE TO RELATED PATENT APPLICATION

This application claims priority to the U.S. Provisional Patent Application Ser. No. 62/860,883 filed on Jun. 13, 2019, which application is incorporated herein by reference in its entirety.

This application claims the benefit of priority to China Patent Application Nos. 202010313649.4, filed on Apr. 20, 2020, and 202022847064.9, filed on Dec. 1, 2020 in People's Republic of China. The entire content of the above identified application is incorporated herein by reference.

This application is a continuation-in-part of U.S. application Ser. No. 16/898,617, filed on 11 Jun. 2020 and entitled "SUBSTRATE STRUCTURE WITH BURIED CHIP AND LIGHT EMITTING DEVICE USING THE SAME", now pending. The entire disclosures of which are incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a multiple pixel package structure, and more particularly to a multiple pixel package structure with a buried chip and an electronic device using the same.

BACKGROUND OF THE DISCLOSURE

Light emitting diodes (LED) have the advantages of small size, high luminous efficiency, low energy consumption and being environment-friendly, and can produce lights in various colors. Therefore, LED package products are now widely used in display devices. In practice, the LED package products use a group of LEDs having the same color or different colors to produce a desired lighting effect. In order to control the lighting characteristics of the LEDs, the LEDs are packaged on a single-layered circuit board together with an individual IC chip.

However, under the above-mentioned structure, the LEDs are electrically connected to the IC chip by wire bonding, and thus spaces are required to be reserved on the circuit board for wire bonding. As a result, the gaps between the LEDs may not be reduced significantly, which is unfavorable for product miniaturization. In addition, lights emitted at some angles may be blocked by the IC chip, which negatively affects the lighting effect (e.g., white balance) of the LED package products. In addition, the wire bonding process is relatively complicated, and the wires formed thereby can easily break under stress, resulting in poor reliability of the LED packaging products.

SUMMARY OF THE DISCLOSURE

In response to the above-referenced technical inadequacies, the present disclosure provides a multiple pixel package structure with a buried chip. The present disclosure further provides an electronic device using the multiple pixel package structure.

In one aspect, the present disclosure provides a multiple pixel package structure with a buried chip, which includes a multi-layered circuit board, a plurality of pixels, a protective layer, and a control chip. The pixels are arranged on the multi-layered circuit board and into an M×N array, wherein M and N are each an integer greater than 1. Each of the pixels includes a plurality of light emitting elements of different colors. The protective layer is formed on the multi-layered circuit board and covers the pixels. The control chip is buried in the multi-layered circuit board and electrically connected to the light emitting elements of each of the pixels, so as to allow each of the pixels to produce a target luminous characteristic.

In certain embodiments, the multi-layered circuit board includes a base layer that has a first surface, a second surface opposite to the first surface, and an open groove passing through the first surface and the second surface. The control chip is disposed in the open groove.

In certain embodiments, an annular space is defined by an outer peripheral surface of the control chip and an inner wall surface of the open groove, and has a width between 10 μm and 100 μm.

In certain embodiments, a thickness of the base layer is 0 μm to 20 μm less than a height of the control chip.

In certain embodiments, the multi-layered circuit board further includes a gap filling layer filled in the annular space to fix the control chip in place.

In certain embodiments, the control chip has an active surface that is perpendicular to the outer peripheral surface and is in proximity to the first surface of the base layer. The active surface has a plurality of electrical contacts. The number of the light emitting elements of each of the pixels is L, and the number of the electrical contacts is M×N×L.

In certain embodiments, the multi-layered circuit board includes a plurality of connecting pads at a bottom thereof. The number of the connecting pads is less than M×N×L.

In certain embodiments, the multi-layered circuit board further includes a plurality of upper patterned metal layers and a plurality of lower patterned metal layers. The upper patterned metal layers are laminated on the first surface of the base layer, and the lower patterned metal layers are laminated on the second surface of the base layer. The control chip is electrically connected to the upper patterned metal layers and the lower patterned metal layers. The pixels are disposed on the outermost one of the upper patterned metal layers.

In certain embodiments, the multi-layered circuit board further includes a plurality of adhesive layers. One of the adhesive layers is formed between the first surface of the base layer and the innermost one of the upper patterned metal layers. Another one of the adhesive layers is formed between the second surface of the base layer and the innermost one of the lower patterned metal layers. The annular space is sealed by the one of the adhesive layers and the another one of the adhesive layers.

In certain embodiments, the gap filling layer is integrated with the one of the adhesive layers and the another one of the adhesive layers.

In certain embodiments, an upper insulating core layer is formed between adjacent two of the upper patterned metal layers, and has a plurality of upper conductive vias for connecting the adjacent two of the upper patterned metal layers. A lower insulating core layer is formed between adjacent two of the lower patterned metal layers, and has a plurality of lower conductive vias for connecting the adjacent two of the lower patterned metal layers.

In certain embodiments, the control chip has an active surface that is in proximity to the first surface of the base layer and has a plurality of electrical contacts. Each of the upper patterned metal layers include an inside circuit and an outside circuit around the inside circuit. The light emitting elements of each of the pixels are electrically connected to the inside circuit of the outermost one of the upper patterned metal layers, and to the corresponding electrical contacts via the inside circuits of the other upper patterned metal layers. The outermost one of the lower patterned metal layers define a plurality of connecting pads. The other one of the lower patterned metal layers includes an outside circuit. A portion of the plurality of the connecting pads are electrically connected to a portion of the plurality of electrical contacts via the outside circuit of the other one of the lower patterned metal layers. Another portion of the plurality of the connecting pads are electrically connected to another portion of the plurality of electrical contacts via the outside circuit of the other one of the lower patterned metal layers and the outside circuits of the upper patterned metal layers.

In one aspect, the present disclosure provides an electronic device, which uses the multiple pixel package structure with the buried chip having the above-described structure.

The beneficial effect(s) of the present embodiment is that the multiple pixel package structure with the buried chip can achieve desired lighting effects required for practical applications and meet the requirements of miniaturization, by the technical features of "the pixels are arranged on the multi-layered circuit board and into an M×N array" and "the control chip is buried in the multi-layered circuit board and electrically connected to the light emitting elements of each of the pixels, so as to allow each of the pixels to produce a target luminous characteristic."

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
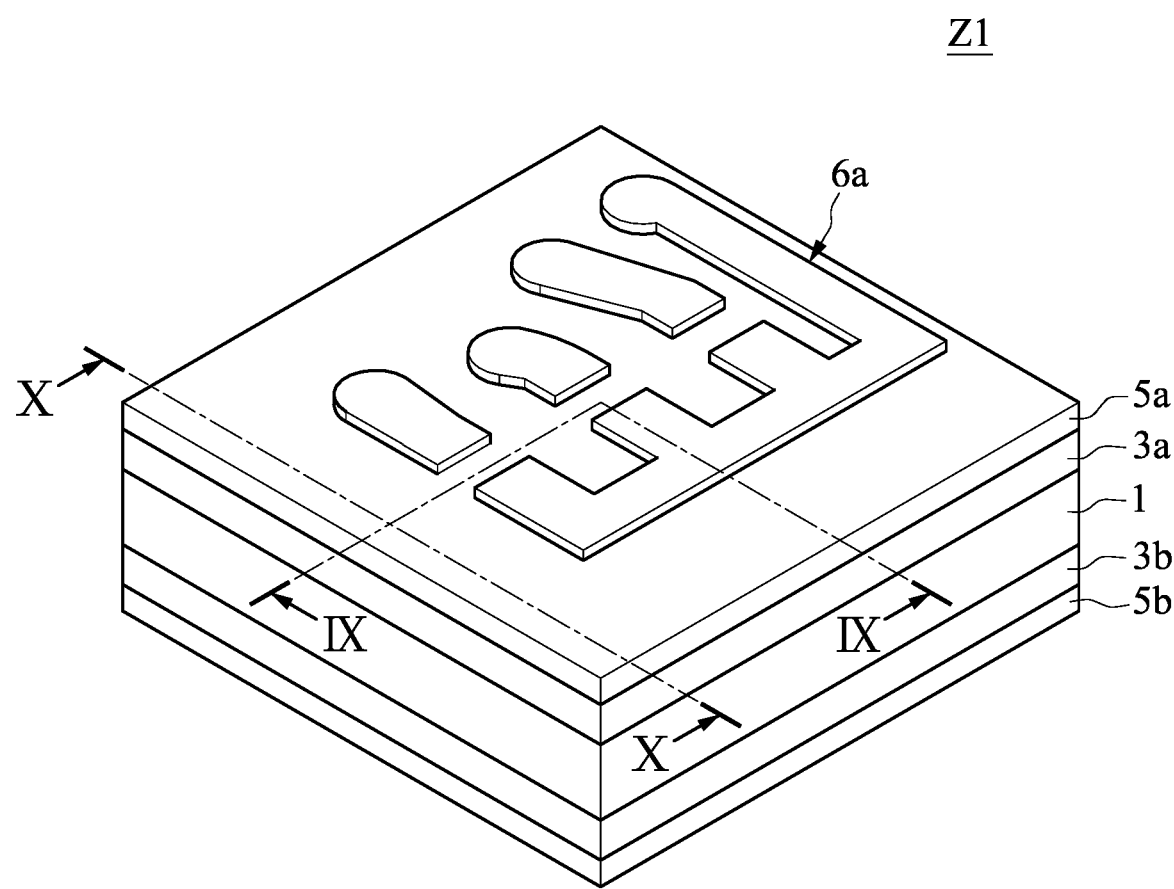
FIG. 1 is a perspective assembled view of a substrate structure with a buried chip of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 10, a first embodiment of the present disclosure provides a substrate structure Z1, which mainly includes a base layer 1, a control chip 2, a first upper insulating core layer 3a and a first lower insulating core layer 3b. The control chip 2 is buried in the base layer 1. The first upper insulating core layer 3a and the first lower insulating core layer 3b are disposed on the base layer 1 to package the control chip 2. The substrate structure Z1 of the present disclosure can be applied to a printed circuit board, but it is not limited thereto.

Reference is made to FIG. 2, FIG. 3, FIG. 6 and FIG. 9. The substrate layer 1 has a first surface 11, a second surface 12 opposite to the first surface 11, and an open groove 13 passing through the first surface 11 and the second surface 12. The first surface 11 is exemplified by an upper surface, and the second surface 12 is exemplified by a lower surface. The control chip 2 is disposed in the open groove 13, and a gap filling layer F is filled in a remaining space of the open groove 13 to fix in place the control chip 2. More specifically, the open groove 13 of the base layer 1 has an inner wall surface 131, and the control chip 2 has an outer peripheral surface 21 that defines an annular space AS together with the inner wall surface 131 of the open groove 13. The annular space AS has a width between 10 μm and 100 m, and preferably between 30 μm and 50 μm.

The first upper insulating core layer 3a and the first lower insulating core layer 3b are respectively disposed on the first surface 11 and the second surface 12 of the base layer 1. Accordingly, the annular space AS is sealed by the first upper insulating core layer 3a and the first lower insulating core layer 3b. In the present embodiment, the gap filling layer F can be formed independently from or integrated with the first upper insulating core layer 3a and the first lower insulating core layer 3b. In certain embodiments, the gap filling layer F is formed by respective portions of the first upper insulating core layer 3a and the first lower insulating core layer 3b, which are filled in the annular space AS.

In the above-mentioned structure, the annular space AS can be sealed by the first upper insulating core layer 3a and the first lower insulating core layer 3b, and the control chip 2 can be stably fixed in place by the gap filling layer F. Accordingly, the first upper insulating core layer 3a and the first lower insulating core layer 3b can provide sufficient cushion and protection for the control chip 2 to ensure the normal operation of the control chip 2, while the width of the annular space AS is between 10 μm and 100 μm. In the present embodiment, the thickness of the base layer 1 is less than or equal to the height of the control chip 2. Preferably, there is a difference of about 0-20 μm between the thickness of the base layer 1 and the height of the control chip 2, and more preferably of 15 μm. The thickness ratio of the first upper insulating core layer 3a to the first lower insulating core layer 3b can be 1:1.

Furthermore, the material of the base layer 1 is different from that of the first upper insulating core layer 3a and that of the first lower insulating core layer 3b. For example, the base layer 1 is formed of a BT (bismaleimide triazine) resin that may have a reinforcing material (e.g., glass fiber). The first upper insulating core layer 3a and the first lower insulating core layer 3b are each formed of a prepreg (PP). The control chip 2 is an LED control chip. However, such examples are not meant to limit the scope of the present disclosure.

In practice, as shown in FIG. 2, FIG. 3, FIG. 5 and FIG. 7, the substrate structure Z1 of the present disclosure can further include a first upper patterned metal layer 4a and a first lower patterned metal layer 4b. The first upper patterned metal layer 4a can be disposed on the first upper insulating core layer 3a, and the first lower patterned metal layer 4b can be disposed on the first lower insulating core layer 3b. The first upper patterned metal layer 4a and the first lower patterned metal layer 4b define signal transmission lines and/or signal transmission interfaces. The first upper patterned metal layer 4a and the first lower patterned metal layer 4b may be formed of copper, but they are not limited thereto.

Figure 5:
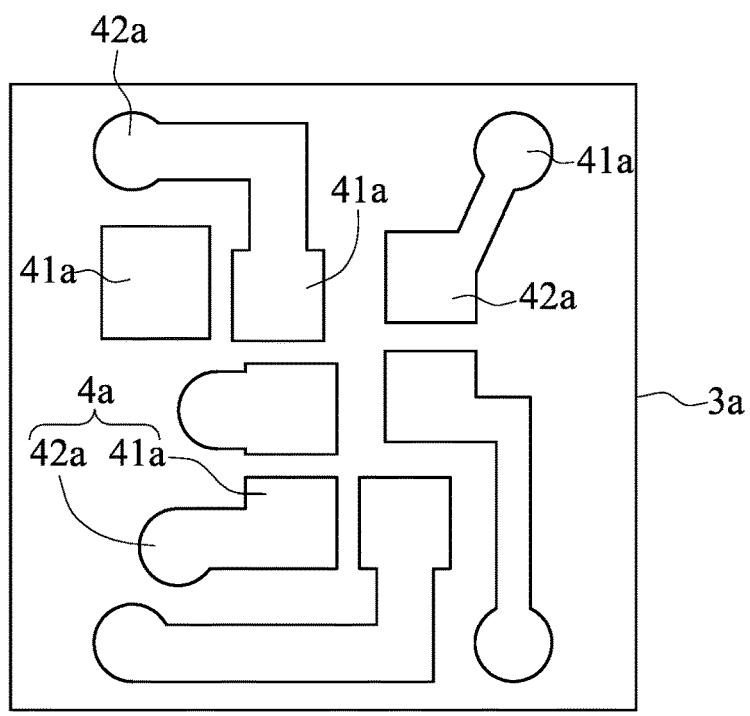
FIG. 5 is a top view of a first upper insulating core layer and a first upper patterned metal layer of the substrate structure with the buried chip of the present disclosure.
Figure 6:
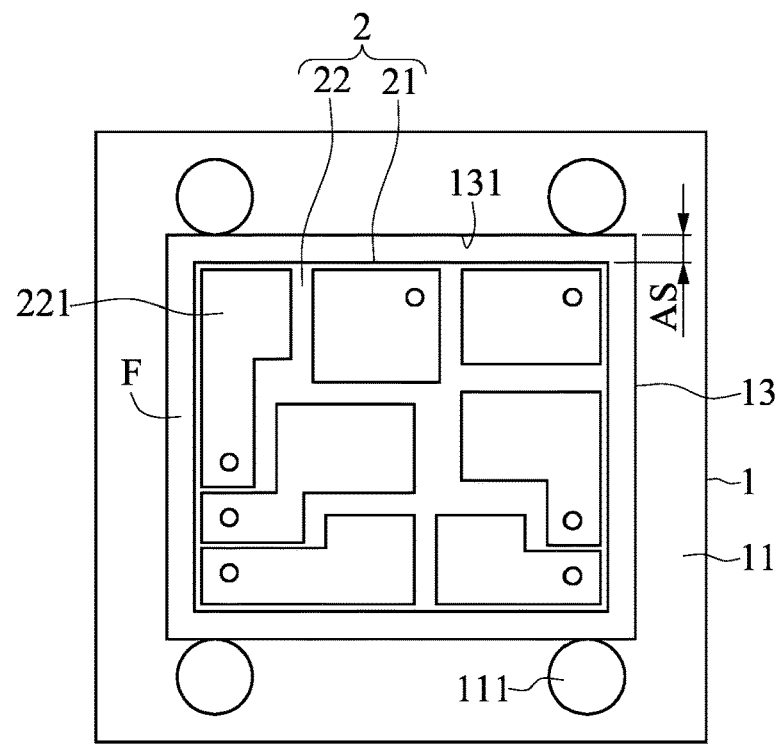
FIG. 6 is a top view of a base layer and a control chip of the substrate structure with the buried chip of the present disclosure.
Figure 7:
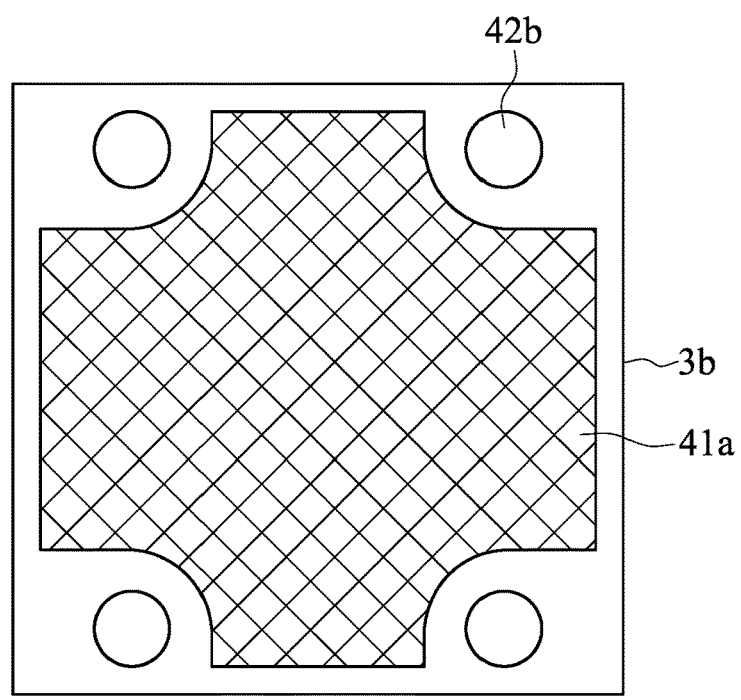
FIG. 7 is a bottom view of a first lower insulating core layer and a first lower patterned metal layer of the substrate structure with the buried chip of the present disclosure.
Figure 8:
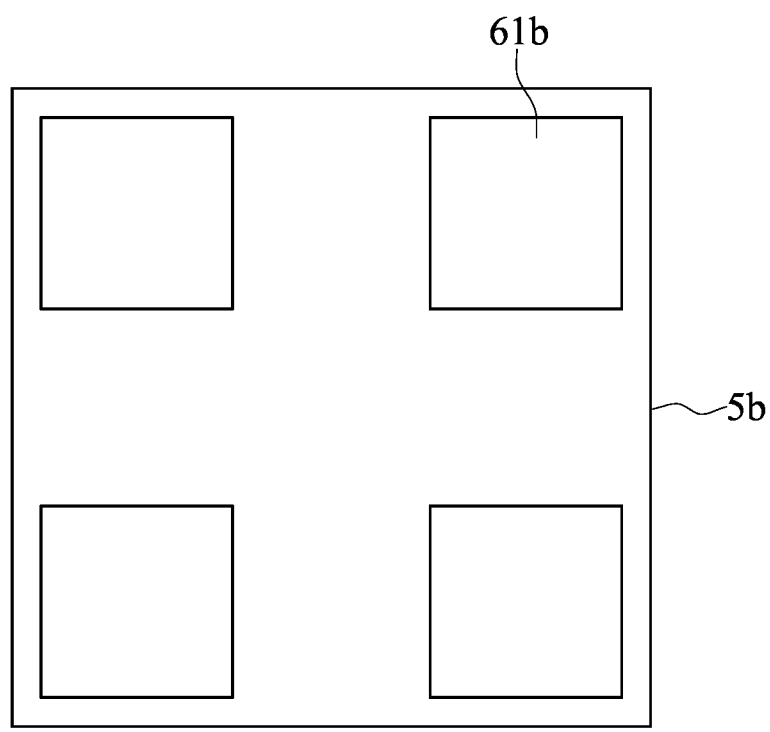
FIG. 8 is a bottom view showing a second lower insulating core layer and a second lower patterned metal layer of the substrate structure with the buried chip of the present disclosure.
Figure 9:
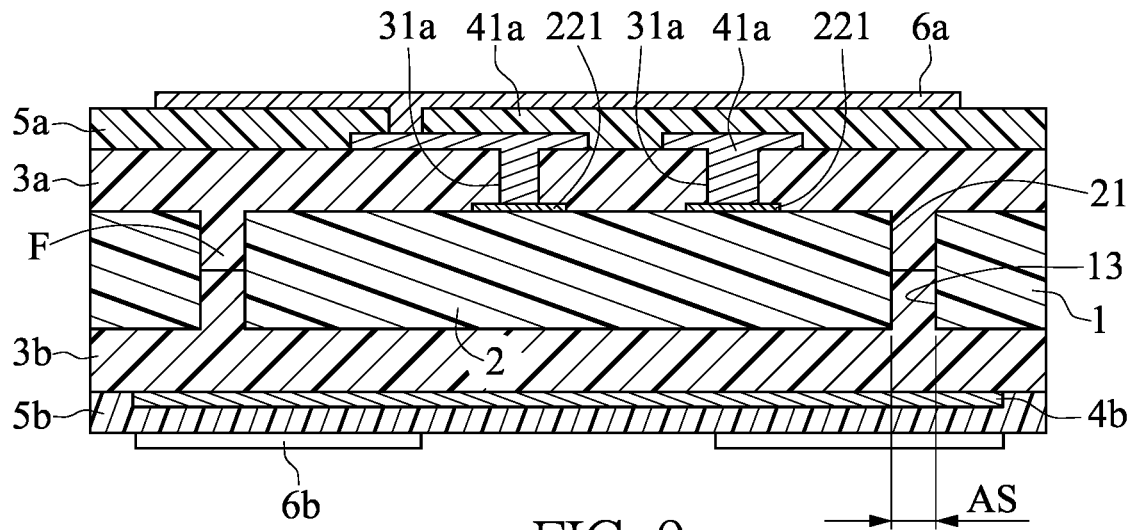
FIG. 9 is a sectional view taken along line IX-IX of FIG. 1.

In the present embodiment, as shown in FIG. 5, FIG. 7 and FIG. 9, the control chip 2 has an active surface 22 and a rear surface (not numbered). The active surface 22 corresponds in position to the first surface 11 of the base layer 1, and has a plurality of electrical contacts 221 formed thereon to receive or transmit electrical signals. The rear surface corresponds in position to the second surface 12 of the base layer 1, and there are no electrical contacts on the rear surface. The first upper patterned metal layer 4a serving as a redistribution layer has a plurality of chip connecting pads 41a and a plurality of first upper conductive pads 42a. The chip connecting pads 41a can lead electrical signals out of the electrical contacts 221 of the control chip 2, and the first upper conductive pads 42a can serve as relay points for signal transmission. The first lower patterned metal layer 4b has a metal mesh layer 41b and a plurality of first lower electrodes 42b adjacent to the metal mesh layer 41b. The metal mesh layer 41b, which does not have any electrical function, is used to provide a balance between the metal amounts of upper and lower sides of the base layer 1, so as to avoid the warpage deformation of the substrate structure Z1 when being heat pressed. The first lower electrodes 42b can also serve as relay points for signal transmission.

Figure 10:
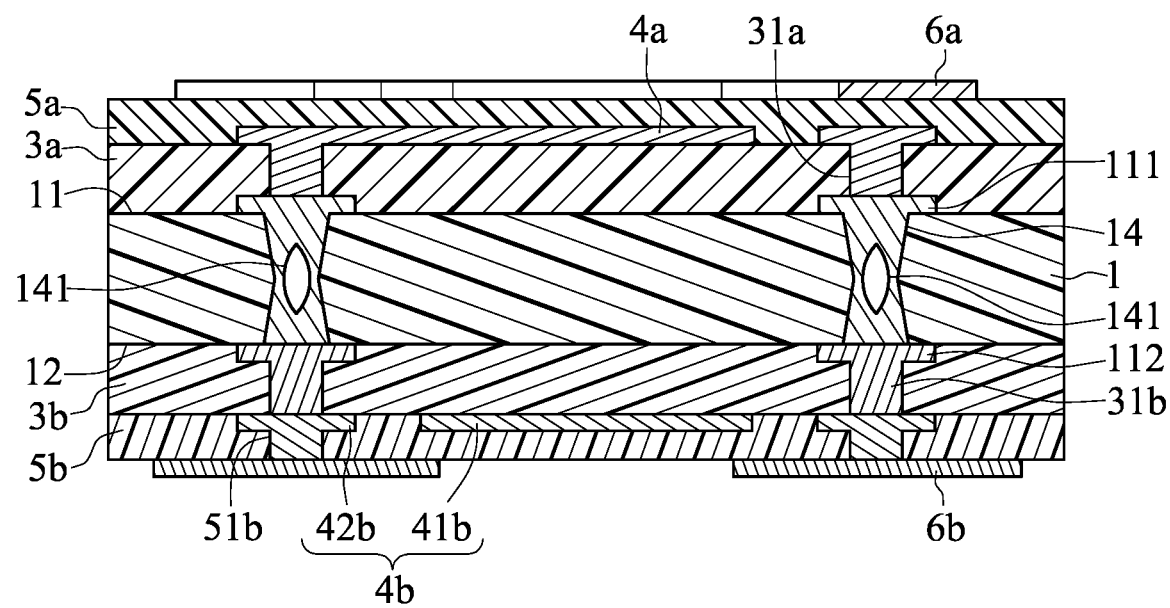
FIG. 10 is a sectional view taken along line X-X of FIG. 1.
Figure 11:
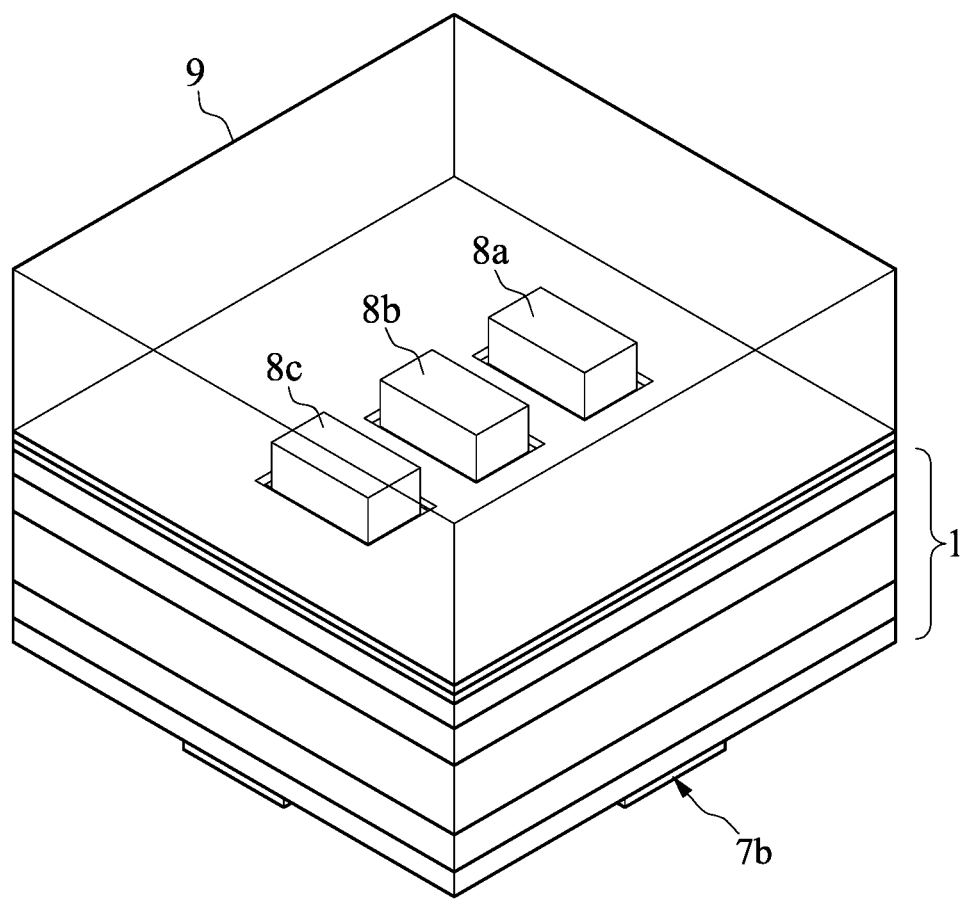
FIG. 11 is a perspective assembled view of a single pixel package structure according to a second embodiment of the present disclosure.
Figure 12:
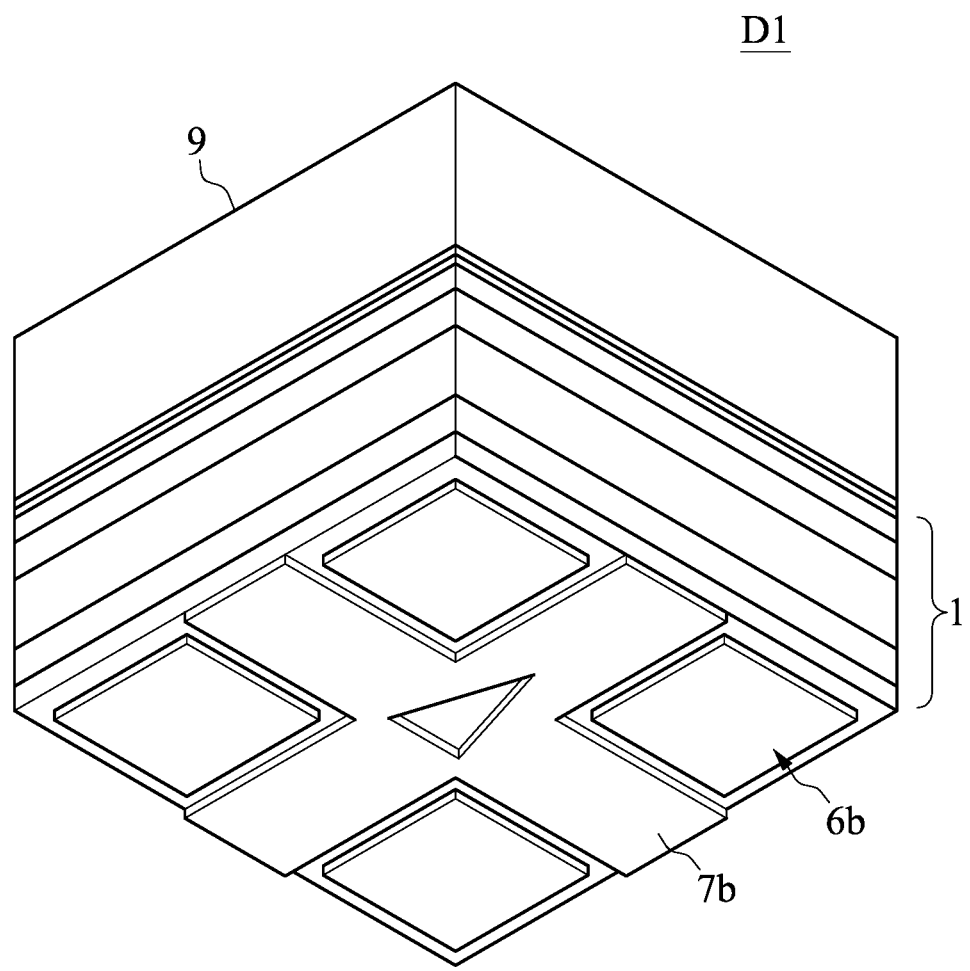
FIG. 12 is another perspective assembled view of the single pixel package structure according to the second embodiment of the present disclosure.
Figure 13:
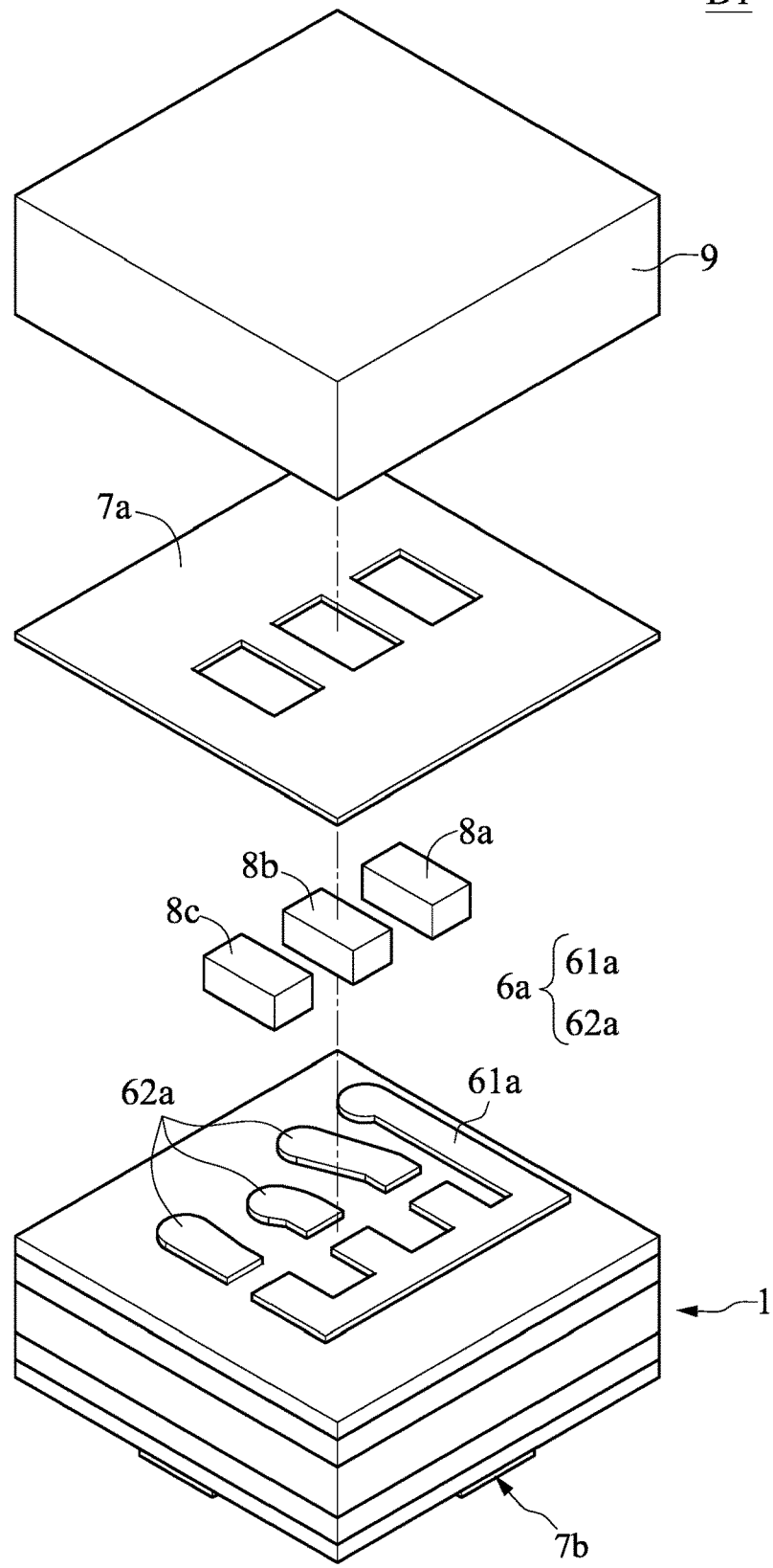
FIG. 13 is a perspective partially exploded view of the single pixel package structure according to the second embodiment of the present disclosure.
Figure 14:
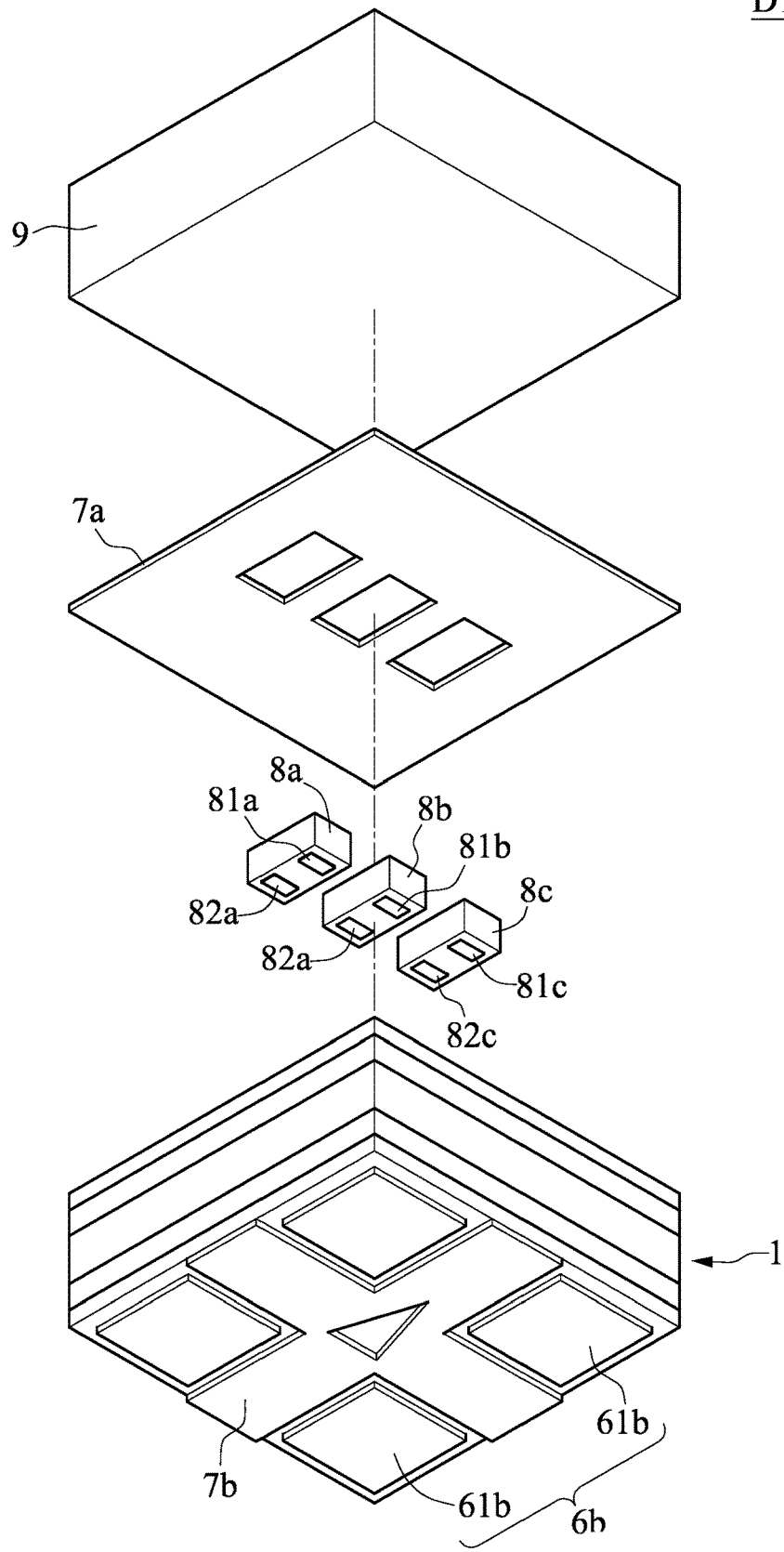
FIG. 14 is another perspective partially exploded view of the single pixel package structure according to the second embodiment of the present disclosure.

In an embodiment of the present disclosure, as shown in FIG. 10, the base layer 1 has a plurality of mid conductive vias 14 that are in proximity to the open groove 13. Furthermore, the first surface 11 and the second surface 12 of the base layer 1 are respectively formed with a plurality of first mid conductive pads 111 and a plurality of second mid conductive pads 121, which correspond in position to the mid conductive vias 14. Each of the mid conductive vias 14 has an upper end and a lower end, which are respectively connected to the corresponding first mid conductive pad 111 and the corresponding second mid conductive pad 121 to form a signal transmission path in the thickness direction of the substrate structure Z1. The mid conductive vias 14 may be formed of copper, but they are not limited thereto. It is worth mentioning that, in consideration of structural design and manufacture process, the mid conductive vias 14 may each have a void 141 when not completely filled with copper.

As shown in FIG. 5, FIG. 7 and FIG. 9, the first upper insulating core layer 3a has a plurality of first upper conductive vias 31a. A number of the first upper conductive vias 31a correspond in position to the chip connecting pads 41a of the first upper patterned metal layer 4a and the electrical contacts 221 of the control chip 2, i.e., are respectively connected between the chip connecting pads 41a and the electrical contacts 221. Another number of the first upper conductive vias 31a correspond in position to the first upper conductive pads 42a of the first upper patterned metal layer 4a and the first mid conductive pads 111, i.e., are respectively connected between the first upper conductive pads 42a and the first mid conductive pads 111. The first lower insulating core layer 3b has a plurality of first lower conductive vias 31b that correspond in position to the second mid conductive pads 121 and the first lower conductive pads 42b of the first lower patterned metal layer 4b, i.e., are respectively connected between the second mid conductive pads 121 and the first lower conductive pads 42b. The first upper conductive vias 31a and the first lower conductive vias 31b may be formed of copper, but they are not limited thereto.

Figure 2:
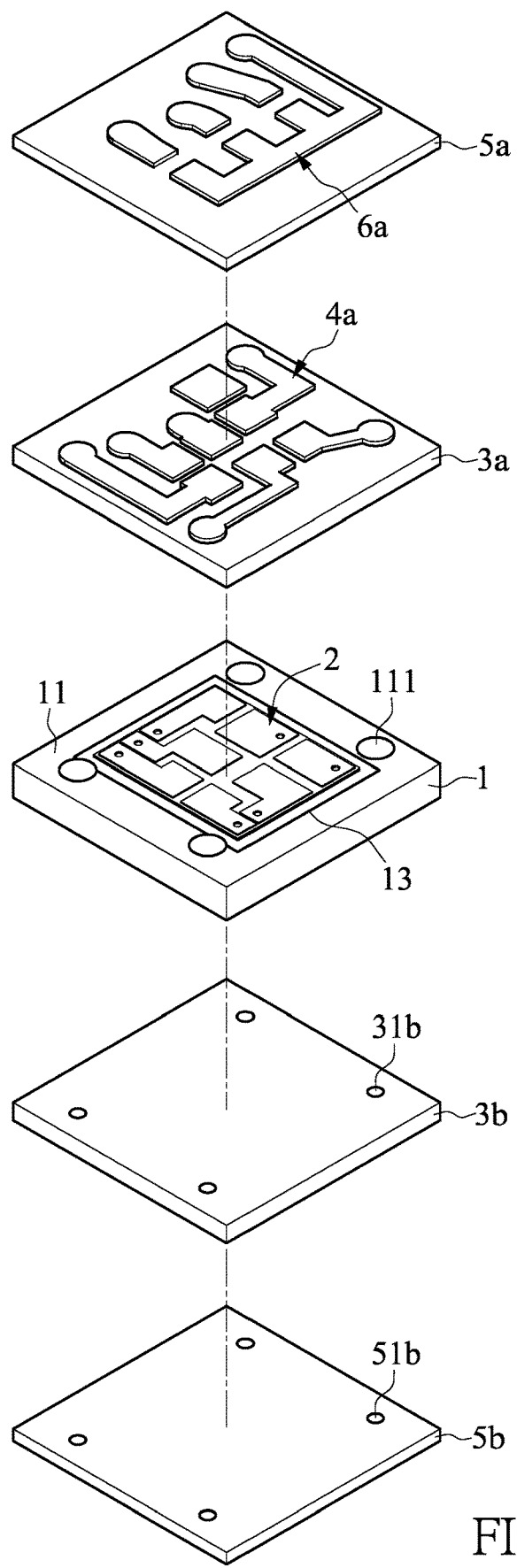
FIG. 2 is a perspective exploded view of the substrate structure with the buried chip of the present disclosure.
Figure 3:
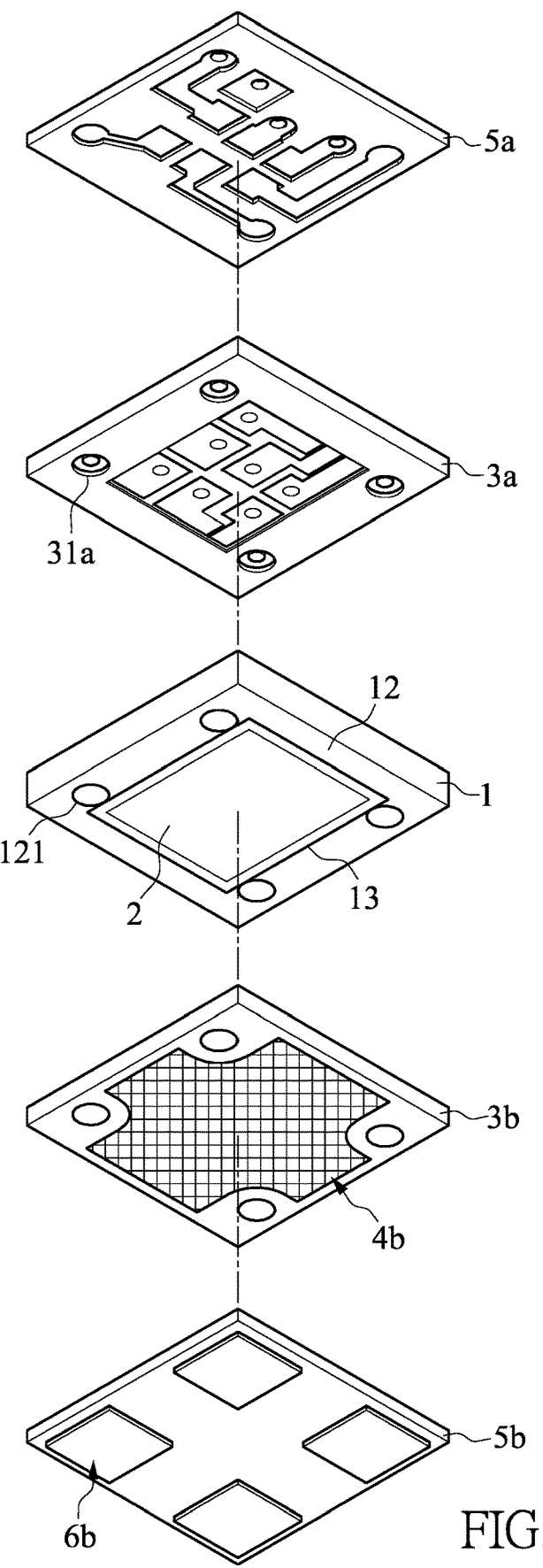
FIG. 3 is another perspective exploded view of the substrate structure with the buried chip of the present disclosure.
Figure 4:
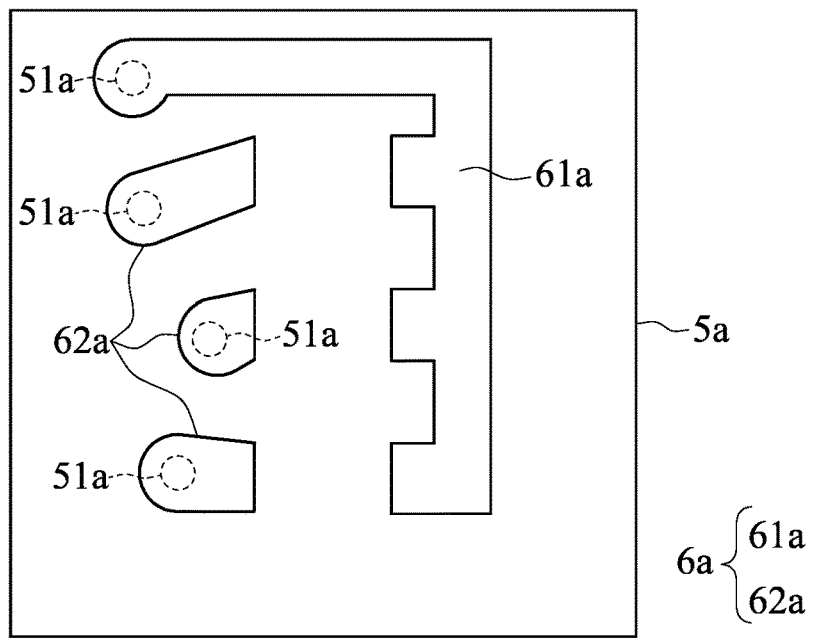
FIG. 4 is a top view showing a second upper insulating core layer and a second upper patterned metal layer of the substrate structure with the buried chip of the present disclosure.

As shown in FIG. 2, FIG. 4 and FIG. 7, the substrate structure Z1 of the present disclosure can further include a second upper insulating core layer 5a and a second lower insulating core layer 5b for the building-up of circuits. The second upper insulating core layer 5a is disposed on the first upper patterned metal layer 4a, and the second lower insulating core layer 5b is disposed on the first lower patterned metal layer 4b. In the present embodiment, the thickness ratio of the second upper insulating core layer 5a to the second lower insulating core layer 5b can be 1:1.2. The second upper insulating core layer 5a and the second lower insulating core layer 5b can each be formed of a prepreg (PP), but they are not limited thereto. Accordingly, the substrate structure Z1 can further include a second upper patterned metal layer 6a and a second lower patterned metal layer 6b. The second upper patterned metal layer 6a is disposed on the second upper insulating core layer 5a, and the second lower patterned metal layer 6b is disposed on the second lower insulating core layer 5b. The second upper patterned metal layer 6a and the second lower patterned metal layer 6b define signal transmission lines, signal transmission interfaces and/or a connection interface of an external electronic device/functional electronic component. The second upper patterned metal layer 6a and the second lower patterned metal layer 6b may be formed of copper, but they are not limited thereto. The technical features of the second upper patterned metal layer 6a and the second lower patterned metal layer 6b will be described in detail in the following embodiments.

In practice, the substrate structure Z1 of the present disclosure can further include at least one solder mask layer (not shown). The solder mask layer can be formed on the second upper patterned metal layer 6a and expose a portion of the second upper patterned metal layer 6a (e.g., a connection interface). The solder mask layer can also be formed on the second lower insulating core layer 5b without overlapping the second lower patterned metal layer 6b.

The beneficial effect(s) of the present embodiment is that the substrate structure can provide sufficient cushion and protection for the control chip to ensure the normal operation of the control chip, by the technical features of "the control chip is disposed in the open groove of the base layer and defines an annular space having a width between 30 μm and 50 μm, in which a portion of the first upper insulating core layer and a portion of the first lower insulating core layer are filled in the annular space and integrated into one body." Furthermore, the control chip is individually packaged in the substrate structure, and the light emitting elements are each mounted on the substrate structure in a flip-chip manner. Accordingly, the area of the substrate structure can be reduced by at least 60%, while the gaps between the light emitting elements are reduced significantly. Therefore, a display device using the light emitting device of the present disclosure can have an enhanced display effect to provide for a user's enjoyment.

Second Embodiment

Referring to FIG. 11 to FIG. 14, along with FIG. 2 to FIG. 5, a second embodiment of the present disclosure provides a single pixel package structure D1 that uses flip-chip package technology. The single pixel package structure D1 includes a substrate structure Z1, a plurality of light emitting elements and a protective layer 9. The light emitting elements are disposed on the substrate structure Z1, and the protective layer 9 covers the light emitting elements. The technical details of the substrate structure Z1 are described in the first embodiment, and will not be reiterated herein. In the present embodiment, the light emitting elements are respectively a first lighting element 8a, a second lighting element 8b and a third lighting element 8c, which are disposed on the second upper patterned metal layer 6a of the substrate structure Z1 and arranged in a row at predetermined intervals, but they are not limited thereto.

In an embodiment of the present disclosure, the second upper patterned metal layer 6a has a common electrode 61a and a plurality of individual electrodes 62a. The first lighting element 8a, the second lighting element 8b and the third lighting element 8c are each a flip-chip type LED, each of which has a first electrode 81a, 81b, 81c and a second electrode 82a, 82b, 82c. The first electrodes 81a, 81b, 81c have the same polarity (e.g., anode polarity) and are all bonded to the common electrode 61a. The second electrodes 82a, 82b, 82c have the same polarity (e.g., cathode polarity) and are respectively bonded to the individual electrodes 62a. Therefore, wiring bonding spaces are not required on the second upper patterned metal layer 6a, which contributes to reducing the gaps between the light emitting elements. Furthermore, the single pixel package structure D1 is provided without bonding wires, so that the reliability of the single pixel package structure D1 can be increased.

The second upper insulating core layer 5a has a plurality of second upper conductive vias 51a, each of which has one end connected to the common electrode 61a or the corresponding one of the individual electrodes 62a of the second upper patterned metal layer 6a and the other end connected to the corresponding one of the chip connecting pads 41a or the first upper conductive pads 42a of the first upper patterned metal layer 4a. Accordingly, signal transmission paths can be formed in the thickness direction of the substrate structure Z. The second upper conductive vias 51a may be formed of copper, but they are not limited thereto.

In practice, the first lighting element 8a is configured to emit red light. For this purpose, the first lighting element 8a may be a red LED chip, or may include a blue LED chip and a wavelength converting layer formed on the blue LED chip, in which the wavelength converting layer may contain a red phosphor. The second lighting element 8b is configured to emit green light. For this purpose, the second lighting element 8b may be a green LED chip, or may include a blue LED chip and a wavelength converting layer formed on the blue LED chip, in which the wavelength converting layer may contain a green phosphor. The third lighting element 8c is configured to emit blue light. For this purpose, the third lighting element 8c may be a blue LED chip. Accordingly, the lights emitted from the first lighting element 8a, the second lighting element 8b and the third lighting element 8c having different colors can uniformly mix together to produce white light. However, these examples are not meant to limit the scope of the present disclosure. The light colors and implementation manners of the light emitting elements can be changed by persons skilled in the art.

The second lower patterned metal layer 6b of the substrate structure Z has a plurality of connecting pads 61b separated from each other. In use, the single pixel package structure D1 of the present disclosure can be mounted on a circuit board (not shown) by the connecting pads 61b. The second lower insulating core layer 5b has a plurality of second lower conductive vias 51b, each of which has one end connected to the corresponding one of the first lower conductive pads 42b of the first lower patterned metal layer 4b and the corresponding one of the connecting pads 61b of the second lower patterned metal layer 6b. Accordingly, signal transmission paths can be formed in the thickness direction of the substrate structure Z1. The second lower conductive vias 51b may be formed of copper, but they are not limited thereto.

In the present embodiment, the single pixel package structure D1 includes a first solder mask layer 7a and a second solder mask layer 7b. The first solder mask layer 7a can be disposed on the second upper patterned metal layer 6a and expose the common electrode 61a and the individual electrodes 62a. The second solder mask layer 7b can be disposed on the second lower patterned metal layer 6b and expose the connecting pads 61b.

The beneficial effect(s) of the present embodiment is that the single pixel package structure D1, in which the light emitting elements are disposed on the substrate structure as described in the first embodiment, can meet the design requirements of miniaturization and optimize the display effects of displaying devices.

Third Embodiment

Figure 15:
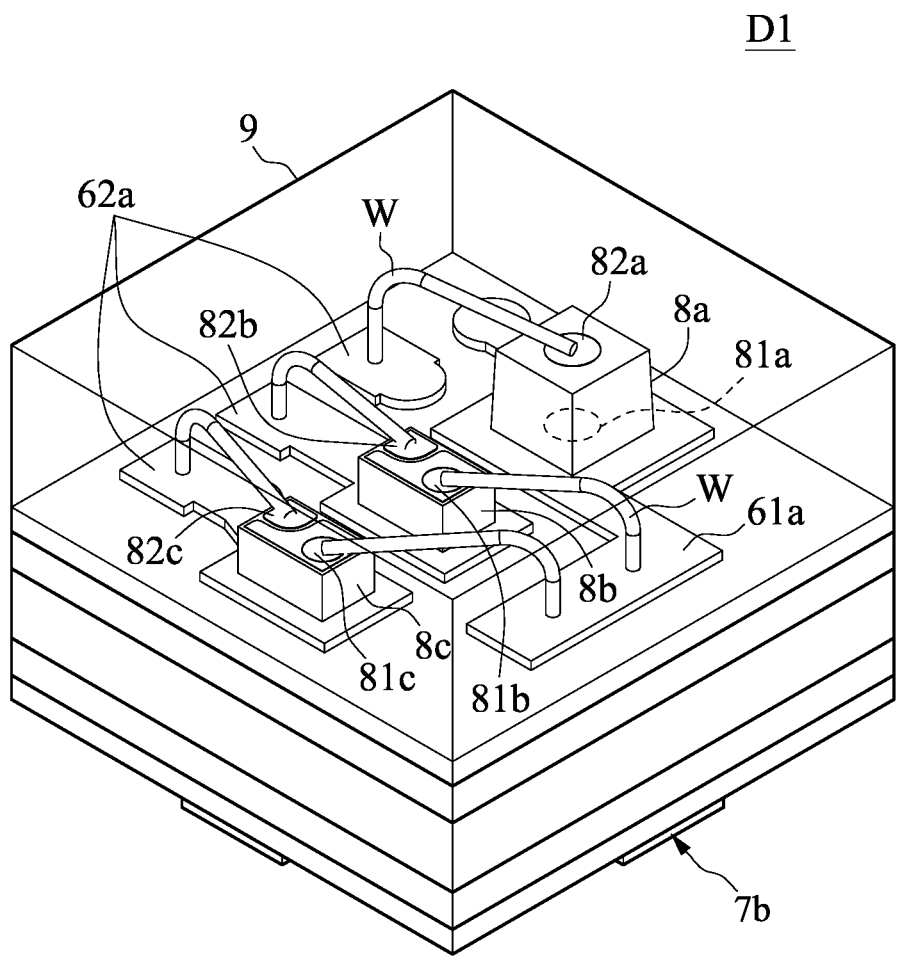
FIG. 15 is a schematic perspective view of a single pixel package structure according to a third embodiment of the present disclosure.
Figure 16:
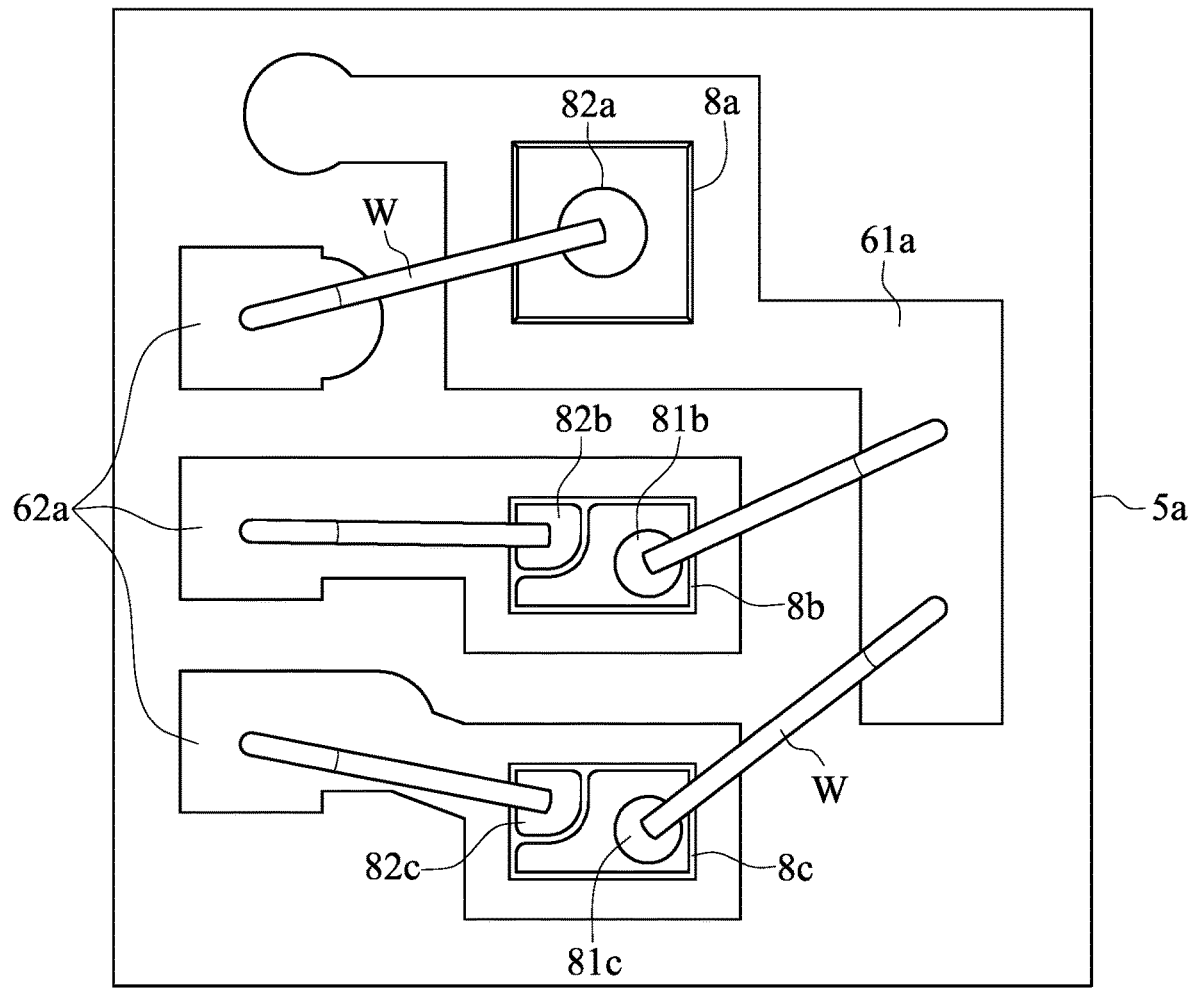
FIG. 16 is a top view of the single pixel package structure according to the third embodiment of the present disclosure.
Figure 17:
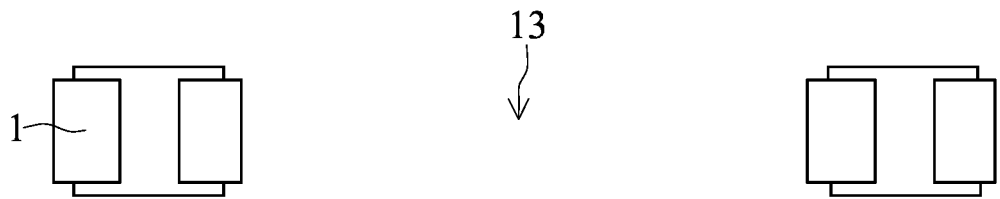
FIG. 17 to FIG. 25 are schematic views showing process steps in a method for manufacturing the substrate structure with the buried chip of the present disclosure.
Figure 18:
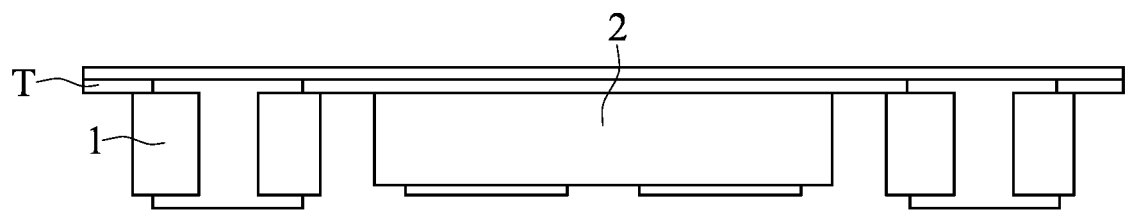
Figure 19:
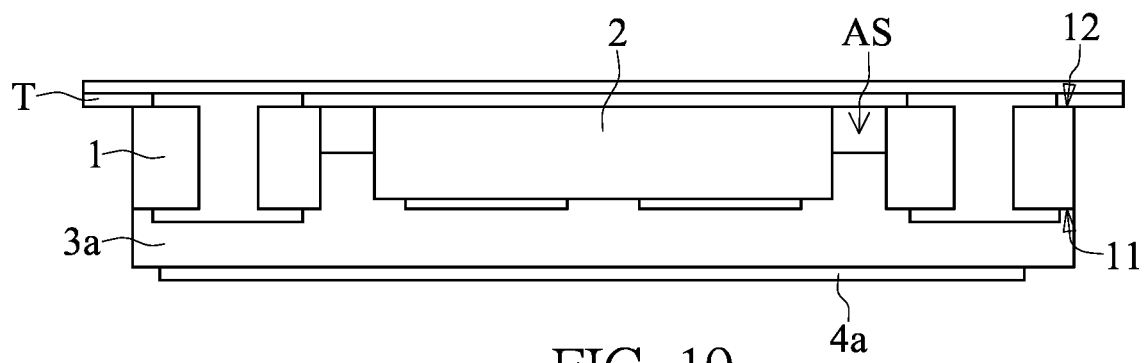
Figure 20:
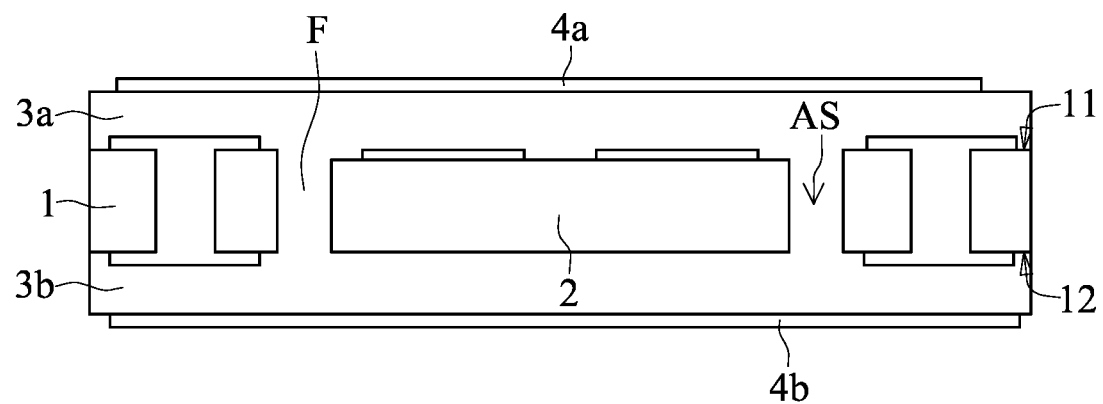
Figure 21:
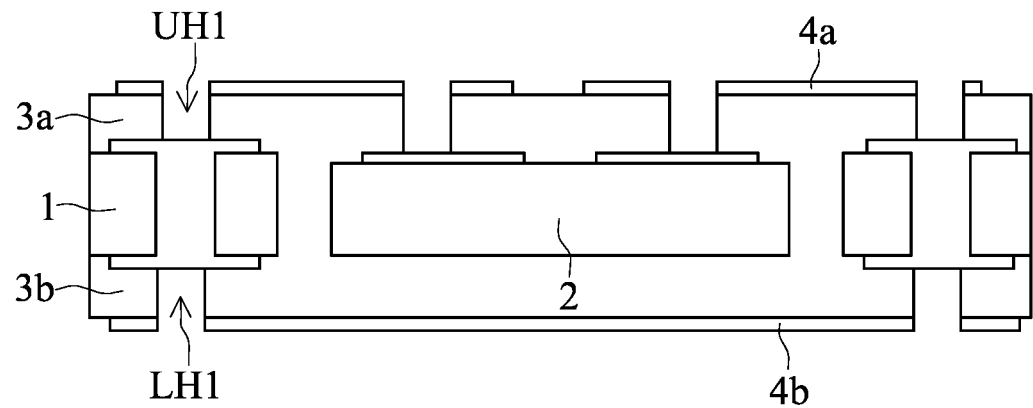
Figure 22:
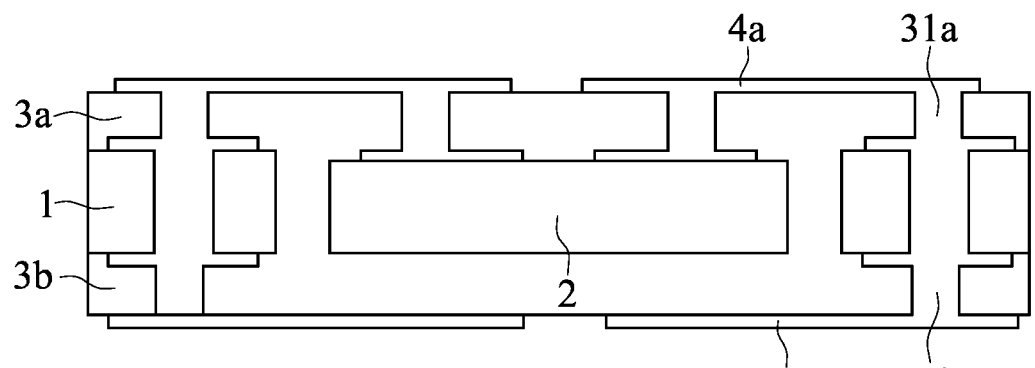
Figure 23:
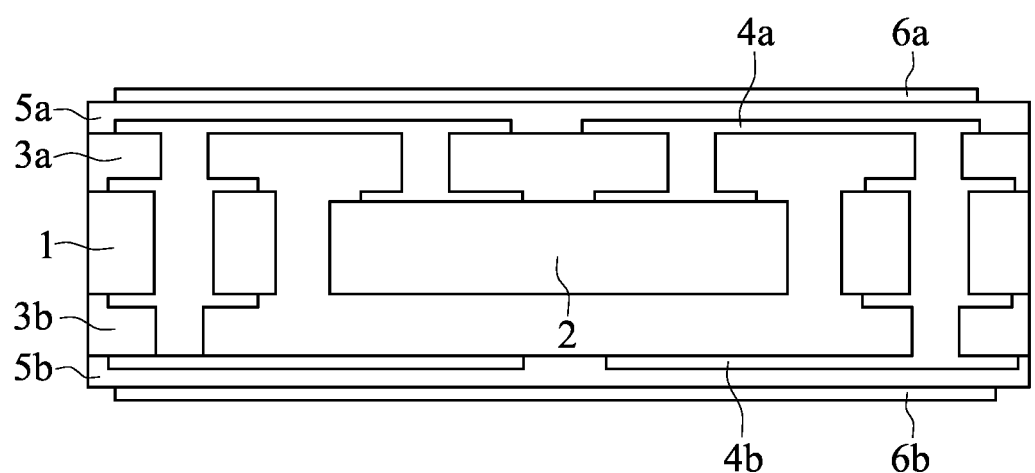
Figure 24:
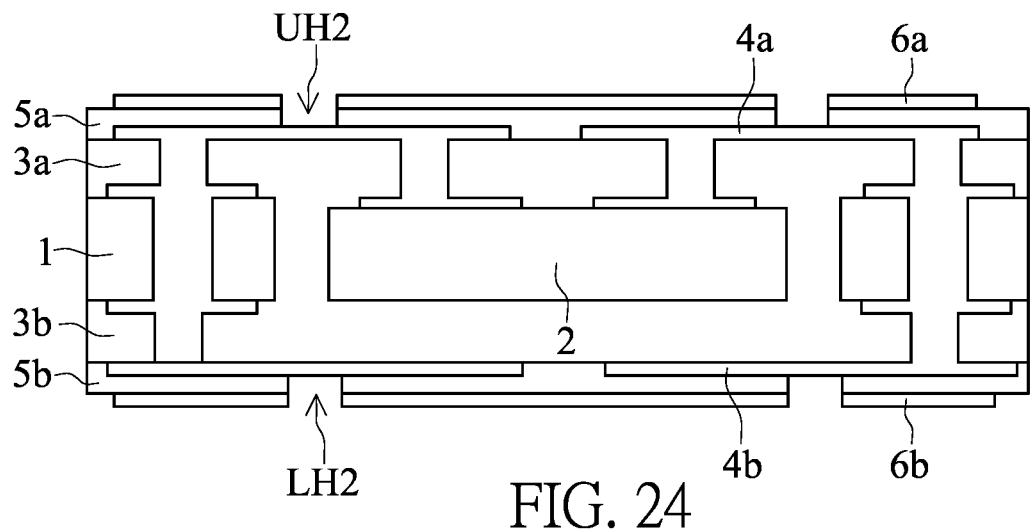
Figure 25:
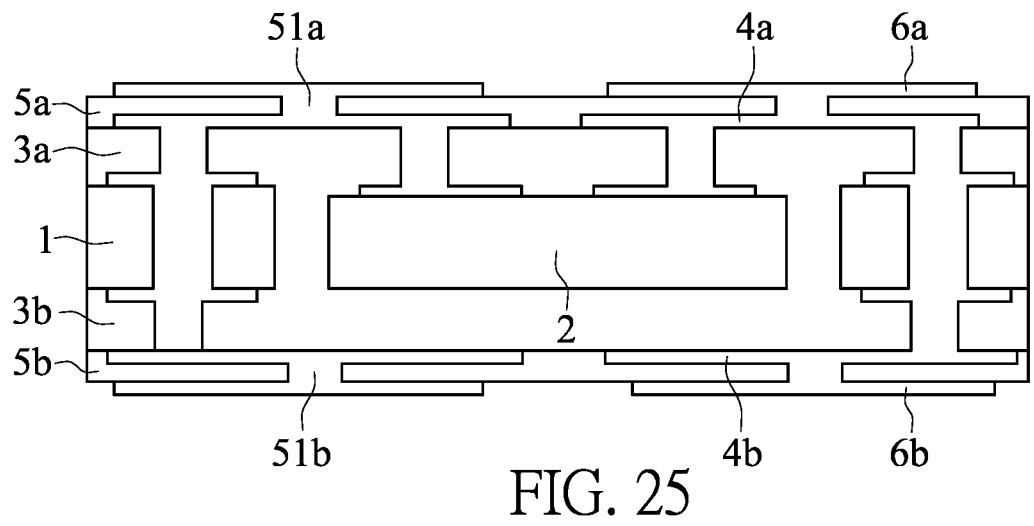

Referring to FIG. 15 and FIG. 16, a third embodiment of the present disclosure provides a single pixel package structure D1 that uses wire bonding package technology. The single pixel package structure D1 includes a substrate structure Z1, a plurality of light emitting elements and a protective layer 9. The light emitting elements are disposed on the substrate structure Z1, and the protective layer 9 covers the light emitting elements. The technical details of the substrate structure Z1 and the light emitting elements are described in the first and second embodiments, and will not be reiterated herein.

In the present embodiment, the first lighting element 8a is a vertical type red LED chip and is disposed on one of the individual electrodes 62a. The first lighting element 8a has a first electrode 81a and a second electrode 82a. The first electrode 81a is located at a top portion of the first lighting element 8a and is electrically connected to the common electrode 61a by a wire W. The second electrode 82a is located at a bottom portion of the first lighting element 8a and is bonded to the corresponding individual electrode 62a. The second lighting element 8b is a horizontal type green LED chip and is disposed on another one of the individual electrodes 62a. The second lighting element 8b has a first electrode 81b and a second electrode 82b, which are located at a top portion thereof and are respectively and electrically connected to the common electrode 61a and the corresponding individual electrode 62a by a wire W. The third lighting element 8c is a horizontal type blue LED chip and is disposed on still another one of the individual electrodes 62a. The third lighting element 8c has a first electrode 81c and a second electrode 82c, which are located at a top portion thereof and are respectively and electrically connected to the common electrode 61a and the corresponding individual electrode 62a by a wire W. However, the above-mentioned description for the light emitting elements is merely an example and is not meant to limit the scope of the present disclosure.

In the present embodiment, the single pixel package structure D1 merely includes a second solder mask layer 7b. The second solder mask layer 7b can be disposed on the second lower resin layer 5b and expose the connecting pads 61b.

The beneficial effect(s) of the present embodiment is that the single pixel package structure D1, in which the light emitting elements are disposed on the substrate structure as described in the first embodiment, can meet the design requirements of miniaturization and optimize the display effects of displaying devices.

Method for Manufacturing Substrate Structure with Buried Chip

Referring to FIG. 17 to FIG. 25, the substrate structure with a buried chip of the present disclosure can be manufactured by the following steps. Firstly, a base layer 1 is provided, which has an open groove 13. The open groove 13 can be formed by laser processing, but it is not limited thereto. Next, the base layer 1 is bonded onto a temporary carrier T such as a polyimide film, and is disposed in the open groove 13 by the temporary carrier T. Next, a first upper insulating core layer 3a is formed on a first surface 11 of the base layer 1, in which a portion of the first upper insulating core layer 3a is filled in an annular space AS of the open groove 13. Then, a first upper metal layer 4A is formed on the first upper insulating core layer 3a. Next, the temporary carrier T is removed, and the resulting semi-product is turned upside down.

Next, a first lower insulating core layer 3b is formed on a second surface 12 of the base layer 1, in which a portion of the first lower insulating core layer 3b is also filled in the annular space AS of the open groove 13, such that the open groove 13 has a gap filling layer F formed therein. Then, a first lower metal layer 4B is formed on the first lower insulating core layer 3b. Next, a plurality of first upper through holes UH1 passing through the first upper insulating core layer 3a and the first upper metal layer 4A are formed, and a plurality of first lower through holes LH1 passing through the first lower insulating core layer 3b and the first lower metal layer 4B are formed. Next, a conductive material is filled in each of the first upper through holes UH1 and each of the first lower through holes LH1. Accordingly, the first upper insulating core layer 3a has a plurality of first upper conductive vias 31a, and the first lower insulating core layer 3b has a plurality of first lower conductive vias 31b. Accordingly, the first upper metal layer 4A and the first lower metal layer 4B are respectively formed into a first upper patterned metal layer 4a and a first lower patterned metal layer 4b.

Next, a second upper insulating core layer 5a and a second lower insulating core layer 5b are respectively formed on the first upper patterned metal layer 4a and the first lower patterned metal layer 4b. Then, a second upper metal layer 6A and a second lower metal layer 6B are respectively formed on the second upper insulating core layer 5a and the second lower insulating core layer 5b. Next, a plurality of second upper through holes UH2 passing through the second upper insulating core layer 5a and the second upper metal layer 6A are formed, and a plurality of second lower through holes LH2 passing through the second lower insulating core layer 5b and the second lower metal layer 6B are formed. Next, a conductive material is filled in each of the second upper through holes UH2 and each of the second lower through holes LH2. Accordingly, the second upper insulating core layer 5a has a plurality of second upper conductive vias 51a, and the second lower insulating core layer 5b has a plurality of second lower conductive vias 51b. Accordingly, the second upper metal layer 6A and the second lower metal layer 6B are respectively formed into a second upper patterned metal layer 6a and a second lower patterned metal layer 6b.

Fourth Embodiment

Figure 26:
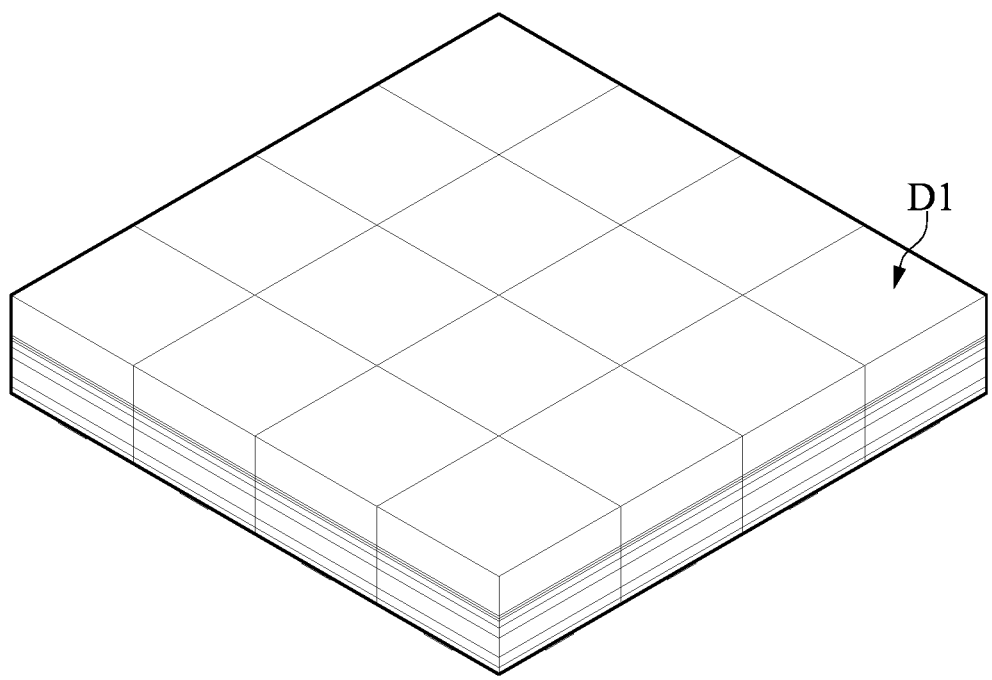
FIG. 26 is a schematic perspective view of a multiple pixel package structure according to a fourth embodiment of the present disclosure.
Figure 27:
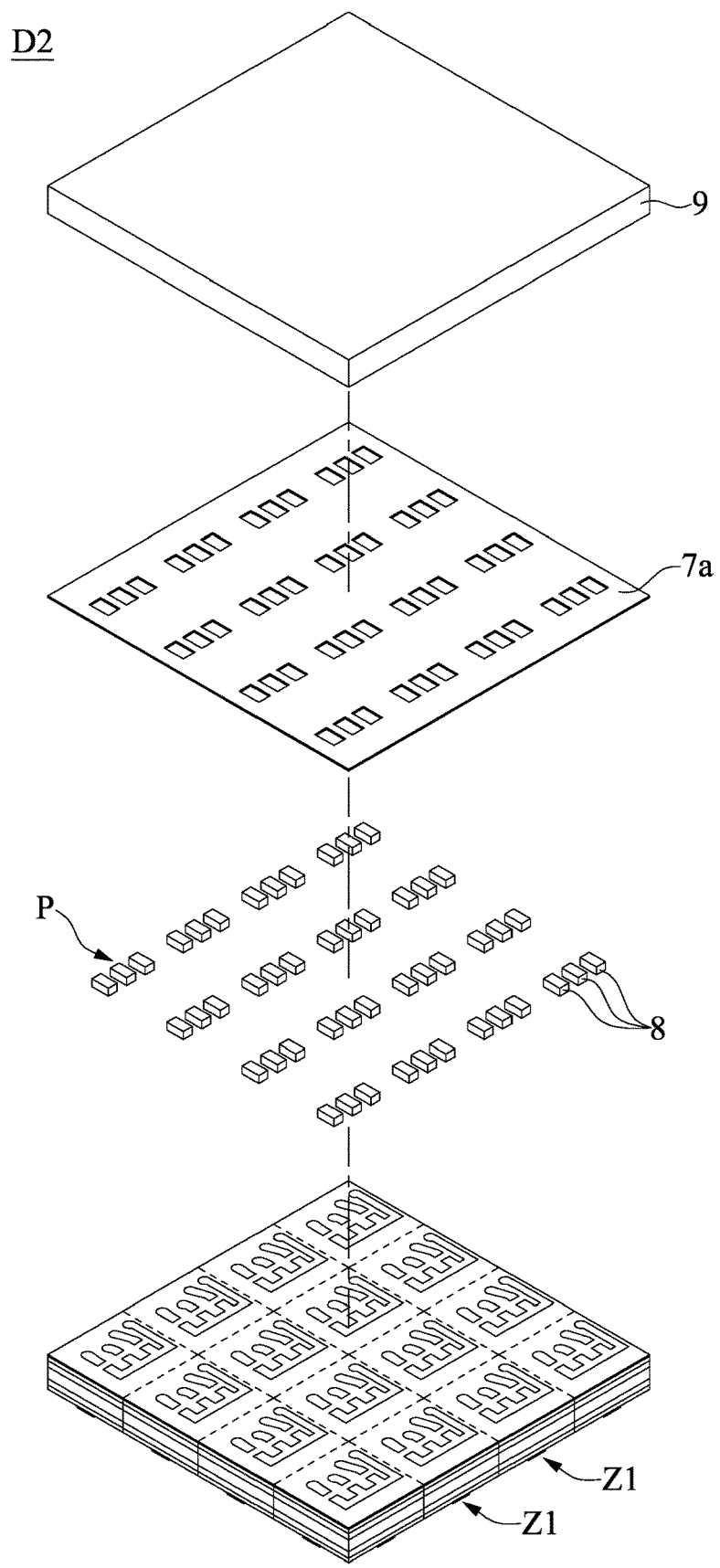
FIG. 27 is a schematic perspective partially exploded view of the multiple pixel package structure according to the fourth embodiment of the present disclosure.
Figure 28:
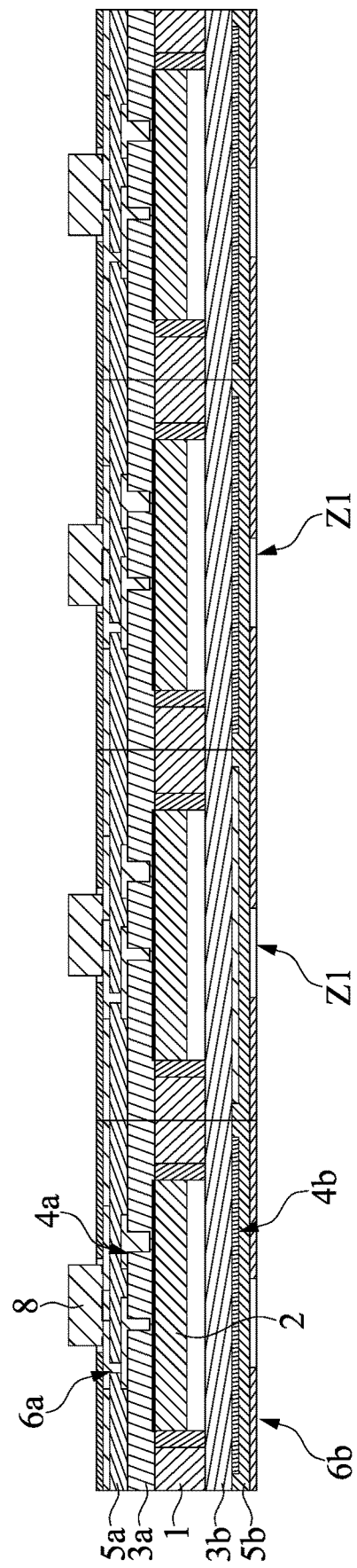
FIG. 28 is a schematic sectional view of the multiple pixel package structure according to the fourth embodiment of the present disclosure.
Figure 29:
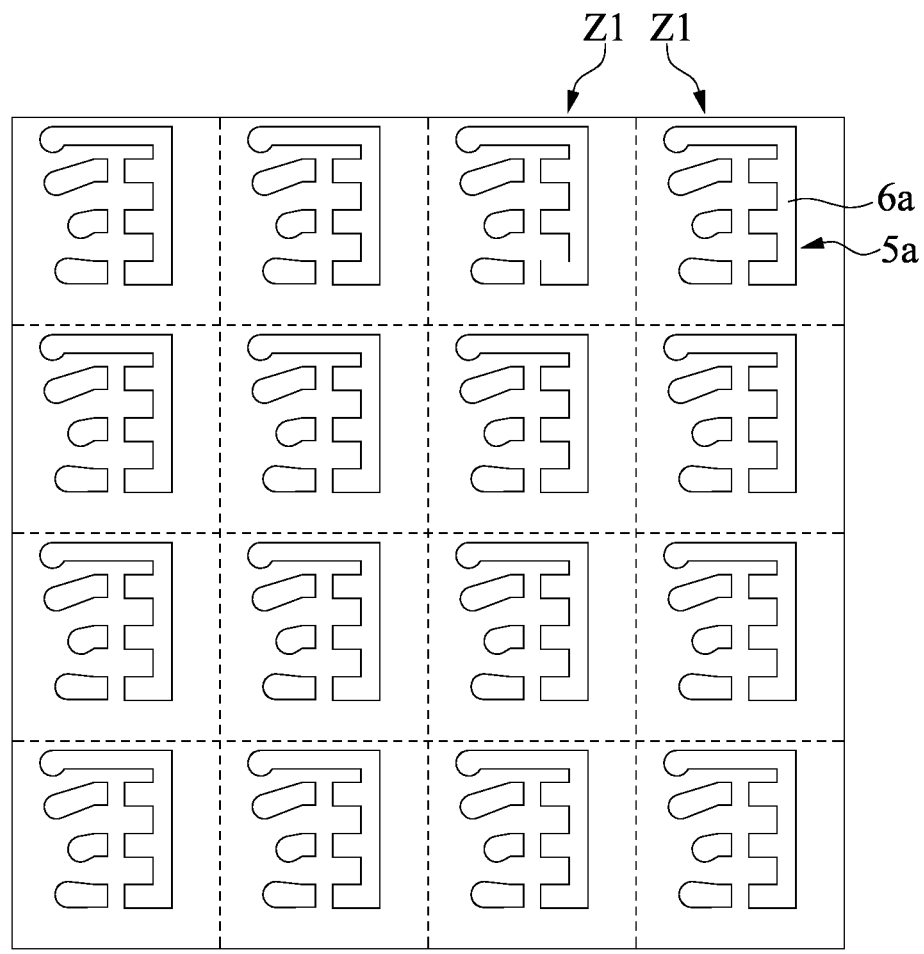
FIG. 29 is a schematic top view of a portion of the multiple pixel package structure according to the fourth embodiment of the present disclosure.
Figure 30:
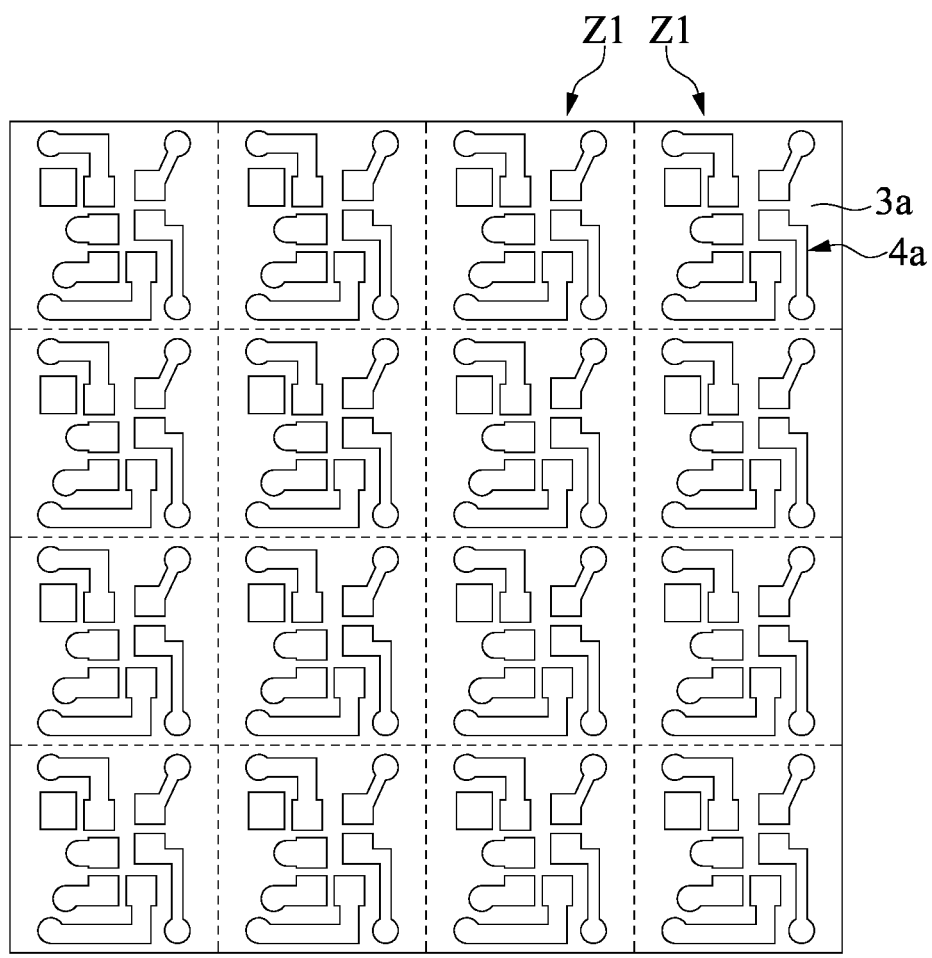
FIG. 30 is a schematic top view of another portion of the multiple pixel package structure according to the fourth embodiment of the present disclosure.
Figure 31:
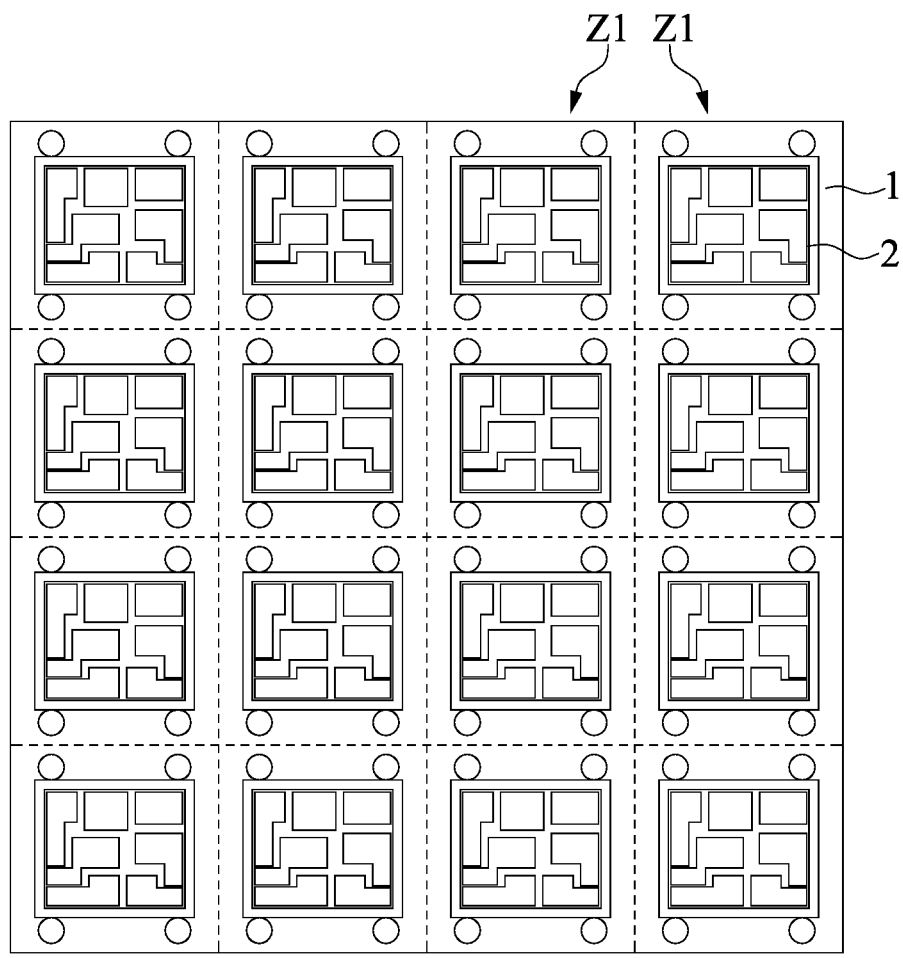
FIG. 31 is a schematic top view of still another portion of the multiple pixel package structure according to the fourth embodiment of the present disclosure.
Figure 32:
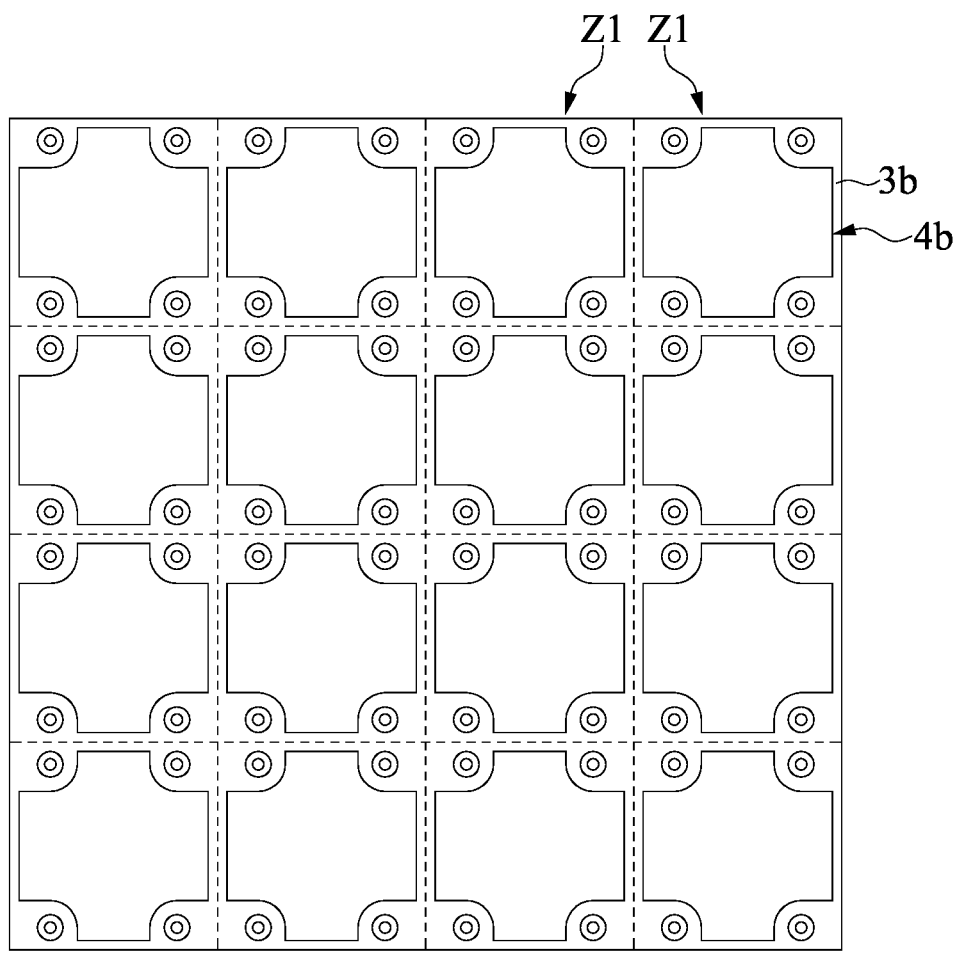
FIG. 32 is a schematic bottom view of a portion of the multiple pixel package structure according to the fourth embodiment of the present disclosure.
Figure 33:
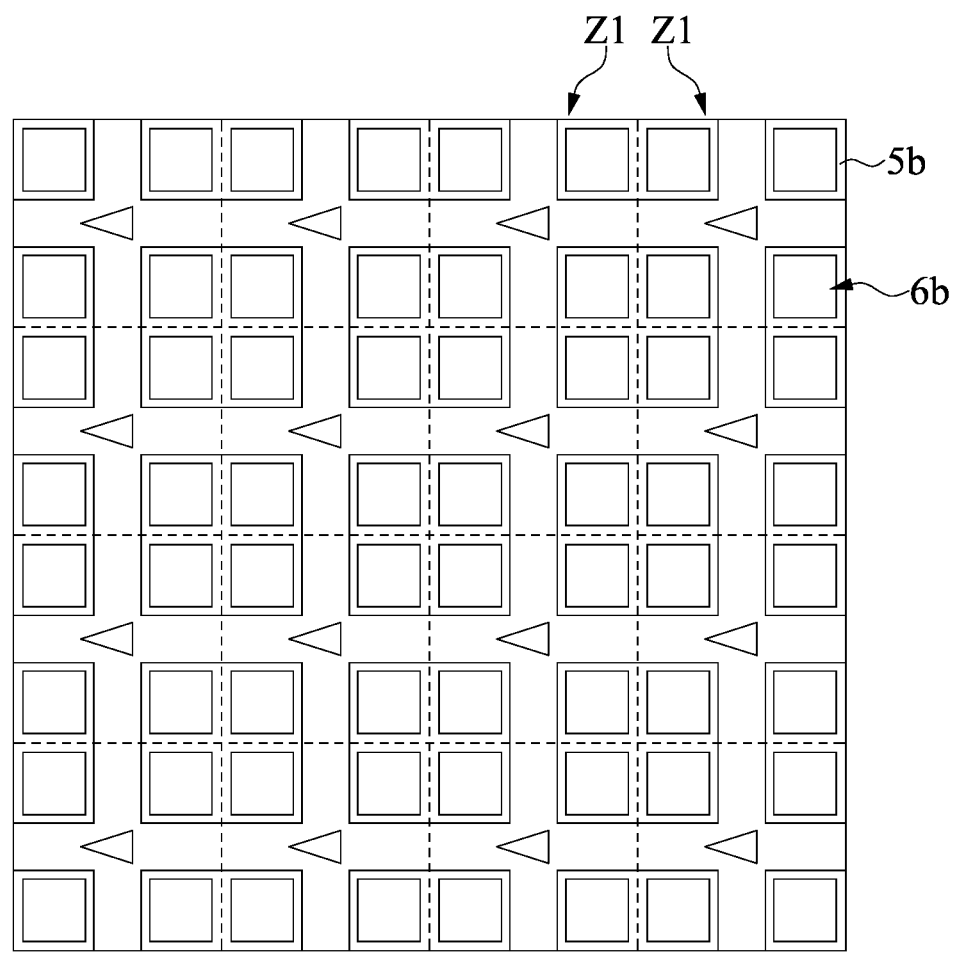
FIG. 33 is a schematic bottom view of another portion of the multiple pixel package structure according to the fourth embodiment of the present disclosure.
Figure 34:
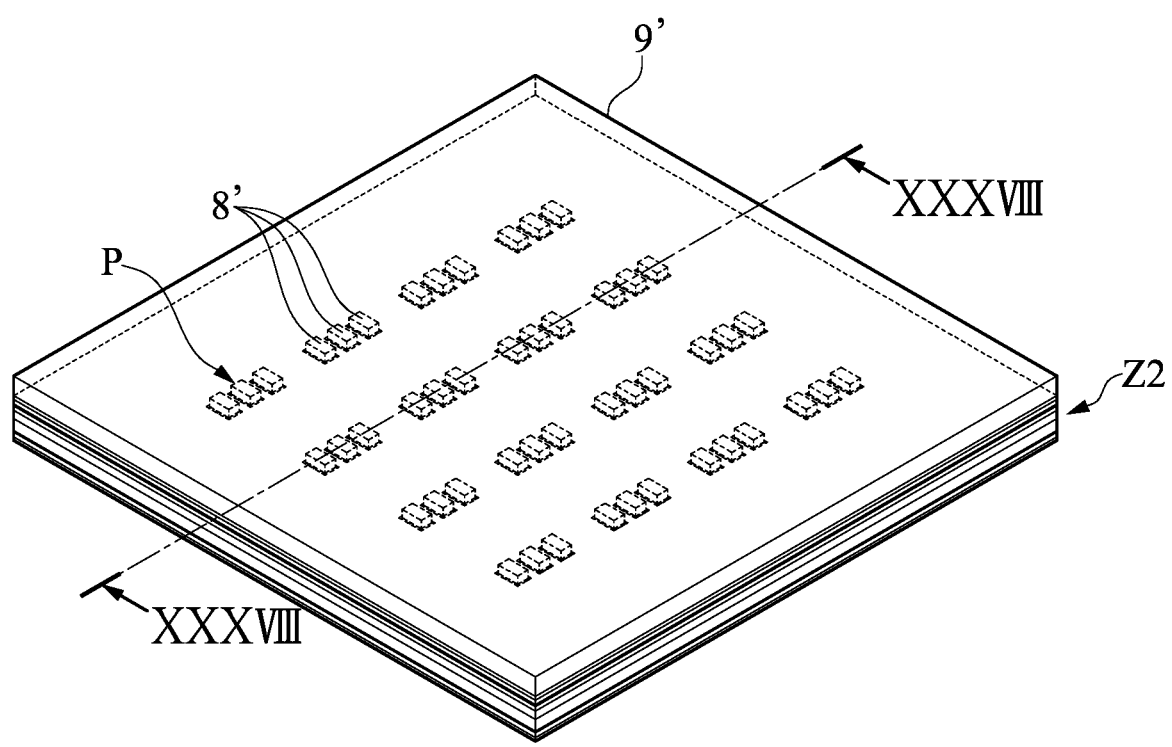
FIG. 34 is a schematic perspective assembled view of a multiple pixel package structure according to a fifth embodiment of the present disclosure.

Referring to FIG. 26 to FIG. 28, a fourth embodiment of the present disclosure provides a multiple pixel package structure D2 which is formed by a plurality of single pixel package structures D1 as described in the second embodiment that are arranged closely adjacent to each other and into an array. In the present embodiment, the single pixel package structures D1 are arranged into an M×N array, wherein M and N are each an integer greater than 1. However, the array form can be changed to achieve a desired luminous effect in practical applications.

As shown in FIG. 29 to FIG. 33, each of the single pixel package structures D1 can include a substrate structure Z1 as described in the first embodiment, a plurality of light emitting elements 8, and a protective layer 9. The light emitting elements 8 are disposed on the substrate structure Z1 to form a pixel P. The protective layer 9 covers the light emitting elements 8. More specifically, the substrate structure Z1 of each of the single pixel package structures D1 can include a base layer 1, a control chip 2, a first upper insulating core layer 3a, a first lower insulating core layer 3b, a first upper patterned metal layer 4a, a first lower patterned metal layer 4b, a second upper insulating core layer 5a, a second lower insulating core layer 5b, a second upper patterned metal layer 6a, and a second lower patterned metal layer 6b. The control chip 2 is buried in the base layer 1. The first upper insulating core layer 3a and the first lower insulating core layer 3b are respectively disposed on two opposite surfaces of the base layer 1 to package the control chip 2. The first upper patterned metal layer 4a is disposed on the first upper insulating core layer 3a, and the lower patterned metal layer 4b is disposed on the first lower insulating core layer 3b, which can define signal transmission lines and/or signal transmission interfaces. The second upper insulating core layer 5a is disposed on the first upper patterned metal layer 4a, and the second lower insulating core layer 5b is disposed on the lower patterned metal layer 4b, which can be used for the building-up of circuits. The second upper patterned metal layer 6a is disposed on the second upper insulating core layer 5a, and the second lower patterned metal layer 6b is disposed on the second lower insulating core layer 5b, which can define signal transmission lines, signal transmission interfaces and/or a connection interface of an external electronic device/functional electronic component. More details can be found in the above-described embodiments, and will not be reiterated herein.

In addition, the number of the light emitting elements 8 in each pixel P is three, which respectively emit red, green and blue lights. The detailed features of each light-emitting element 8 and the connecting manner between each light-emitting element 8 and the corresponding substrate structure Z1 can be found in the above-described embodiments, and will not be reiterated herein. It is worth mentioning that, the light colors and implementation manners of the light emitting elements 8 of each pixel P can be changed by persons skilled in the art.

In practice, the pixels P can be applied with different driving conditions by the respective control chips 2 to produce different luminous characteristics such as color or brightness respectively, or to produce a target luminous characteristic.

Fifth Embodiment

Referring to FIG. 34 to FIG. 38, a fifth embodiment of the present disclosure provides a multiple pixel package structure D2, which includes a multi-layered circuit board Z2, a plurality of pixels P, a protective layer 9', and a control chip 2'. The pixels P are arranged on the multi-layered circuit board Z2 and into an M×N array, wherein M and N are each an integer greater than 1. Each of the pixels P includes a plurality of light emitting elements 8' of different colors. The protective layer 9' is formed on the multi-layered circuit board Z2 and covers the pixels P. The control chip 2' is buried in the multi-layered circuit board Z2 and electrically connected to the light emitting elements 8' of each of the pixels P. In practice, the pixels P can be applied with different driving conditions by the control chip 2', so as to allow the each of the pixels P to produce a target luminous characteristic. Although FIG. 26 and FIG. 28 show that the multiple pixel package structure D2 includes 16 pixels P in a 4×4 array, the number and arrangement of the pixels P can be changed to achieve a desired luminous effect in practical applications.

In the present embodiment, the multi-layered circuit board Z2 can have a plurality of connection interfaces (e.g., electrodes and connecting pads) and a plurality of signal transmission interfaces (e.g., interconnection circuits and conductive structures). The multi-layered circuit board Z2 includes a base layer 1' that has a first surface 11' (e.g., an upper surface), a second surface 12' (e.g., a lower surface)

opposite the first surface 11', and an open groove 13' passing through the first surface 11' and the second surface 12'. The control chip 2' is disposed in the open groove 13'. The pixels P can be respectively disposed on the connection interfaces of the multi-layered circuit board Z2. The number of the light emitting elements 8' in each pixel P is three, which respectively emit red, green and blue lights. The detailed features of each light-emitting element 8' can be found in the second and third embodiments, and will not be reiterated herein. It is worth mentioning that, the light colors and implementation manners of the light emitting elements 8 of each pixel P can be changed by persons skilled in the art.

Figure 38:
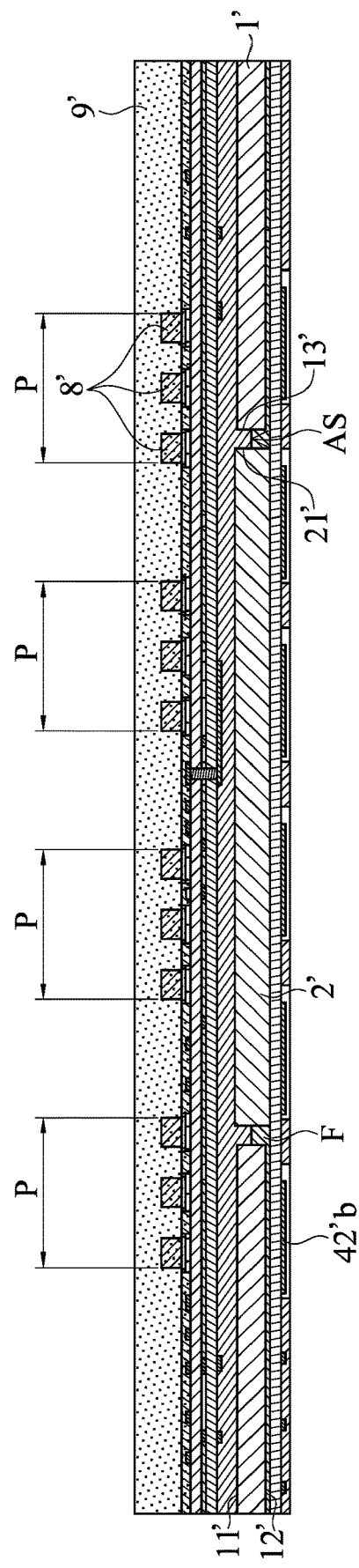
FIG. 38 is a schematic sectional view of the multiple pixel package structure according to the fifth embodiment of the present disclosure.

More specifically, as shown in FIG. 38, the open groove 13' of the base layer 1' has an inner wall surface 131', and the control chip 2' has an outer peripheral surface 21' that define an annular space AS together with the inner wall surface 131'. The annular space AS has a width between 10 μm and 100 μm, and preferably between 30 μm and 50 μm. Furthermore, a gap filling layer F can be filled in the annular space AS to fix the control chip 2' in place. The thickness of the base layer 1' can be less than or equal to the height of the control chip 2'. Preferably, there is a difference of about 0-20 μm between the thickness of the base layer 1' and the height of the control chip 2', and more preferably of 15 μm. A base material of the base layer 1 is a BT (bismaleimide triazine) resin, but is not limited thereto.

Figure 35:
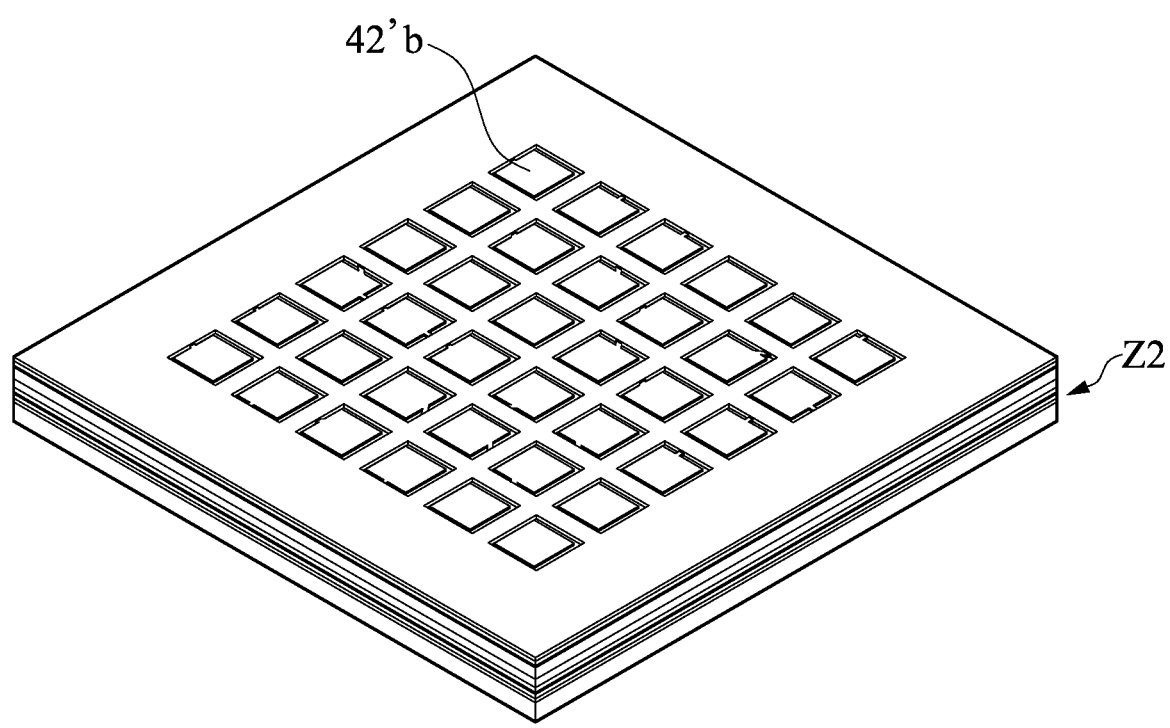
FIG. 35 is another schematic perspective assembled view of the multiple pixel package structure according to the fifth embodiment of the present disclosure.
Figure 36:
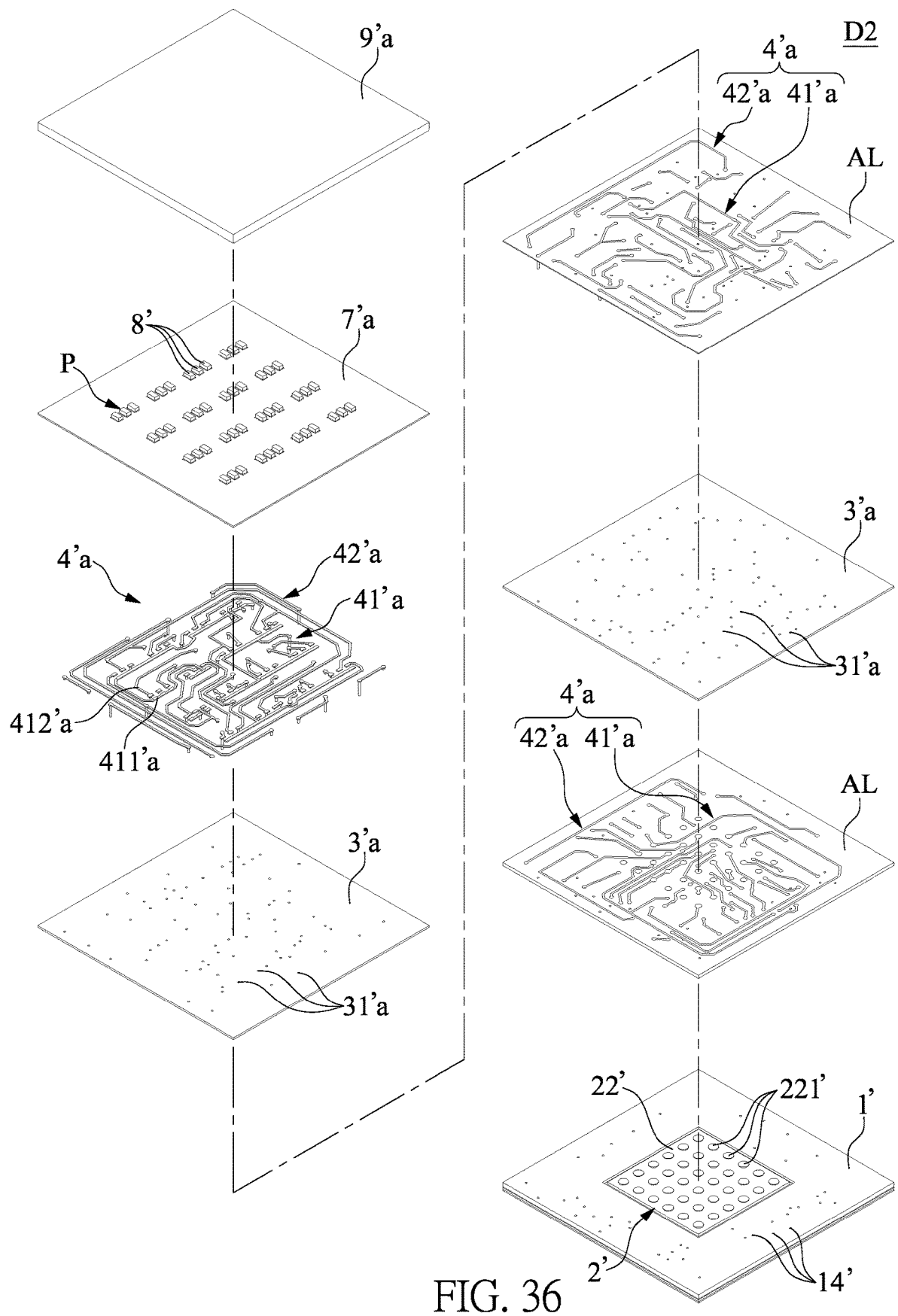
FIG. 36 is a schematic perspective exploded view of the multiple pixel package structure according to the fifth embodiment of the present disclosure.

As shown in FIG. 35 and FIG. 36, in practice, the multi-layered circuit board Z2 further includes a plurality of upper patterned metal layers 4'a and a plurality of lower patterned metal layers 4'b. The upper patterned metal layers 4'a are laminated on the first surface 11' of the base layer 1', in which the pixels P are disposed on the outermost one of the upper patterned metal layers 4'a. The lower patterned metal layers 4'b are laminated on the second surface 12' of the base layer 1', in which the outermost one of the lower patterned metal layers 4'b defines a plurality of connecting pads 42'b. The upper patterned metal layers 4'a and the lower patterned metal layers 4'b can be formed of a metal with good conductivity such as copper, but they are not limited thereto. The control chip 2' is electrically connected to the upper patterned metal layers 4'a and the lower patterned metal layers 4'b. The control chip 2' can receive external signals via the lower patterned metal layers 4'b. Also, the control chip 2' can receive the external signals via the upper patterned metal layers 4'a and the lower patterned metal layers 4'b. Accordingly, the control chip 2' can allow the pixels P to produce respective luminous effects according to the received external signals.

The multi-layered circuit board Z2 further includes at least one upper insulating core layer 3'a and at least one lower insulating core layer 3'b. The at least one upper insulating core layer 3'a is disposed between the upper patterned metal layers 4'a. The at least one lower insulating core layer 3'b is disposed between the lower patterned metal layers 4'b. The at least one upper insulating core layer 3'a and the at least one lower insulating core layer 3'b can each be formed of a prepreg (PP), but they are not limited thereto.

More specifically, an upper insulating core layer 3'a is formed between adjacent two of the upper patterned metal layers 4'a, and has a plurality of upper conductive vias 31'a for connecting the adjacent two of the upper patterned metal layers 4'a. A lower insulating core layer 3'b is formed between adjacent two of the lower patterned metal layers 4'b, and has a plurality of lower conductive vias 31'b for connecting the adjacent two of the lower patterned metal layers 4'b. In addition, the base layer 1' has a plurality of mid conductive vias 14' that are in proximity to the open groove 13' to connect the innermost one of the upper patterned metal layers 4'a and the innermost one of the lower patterned metal layers 4'b. The upper conductive vias 31'a, the lower conductive vias 31'b and the mid conductive vias 14' can be formed of a metal with good conductivity such as copper, but they are not limited thereto.

More specifically, the control chip 2' has an active surface 22'. The active surface 22' is perpendicular to an outer peripheral surface 21' and in proximity to the first surface 11' of the base layer 1', and has a plurality of electrical contacts 221'. In addition, each of the upper patterned metal layers 4'a includes an inside circuit 41'a and an outside circuit 42'a around the inside circuit 41'a. The light emitting elements 8' of each pixel P are electrically connected to the inside circuit 41'a of the outermost one of the upper patterned metal layers 4'a, and to the corresponding electrical contacts 221' via the inside circuits 41'a of the other upper patterned metal layers 4'a. The outermost one of the lower patterned metal layers 4'b defines a plurality of connecting pads 42'b. The other one of the lower patterned metal layers 4'b includes an outside circuit 41'b. A portion of the plurality of the connecting pads 42'b are electrically connected to a portion of the plurality of electrical contacts 221' via the outside circuit 41'b of the other one of the lower patterned metal layers 4'b. Another portion of the plurality of the connecting pads 42'b are electrically connected to another portion of the plurality of electrical contacts 221' via the outside circuit 41'b of the other one of the lower patterned metal layers 4'b and the outside circuits 42'a of the upper patterned metal layers 4'a.

Figure 37:
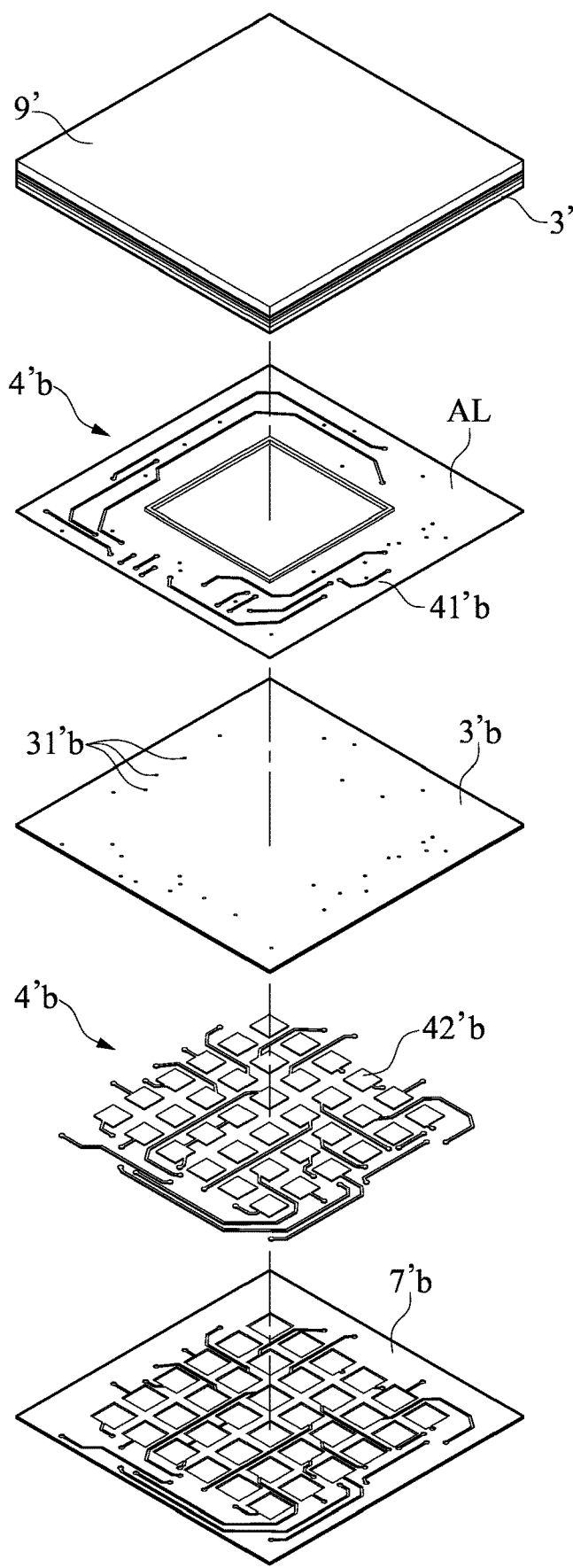
FIG. 37 is another schematic perspective exploded view of the multiple pixel package structure according to the fifth embodiment of the present disclosure.

As shown in FIG. 36 and FIG. 37, in practice, the inside circuits 41'a and the outside circuits 42'a of the other upper patterned metal layers 4'a, the outside circuit(s) 41'b of the lower patterned metal layers 4'b, the upper conductive vias 31'a of the at least one upper insulating core layer 3'a, the lower conductive vias 31'b of the at least one lower insulating core layer 3'b, and the mid conductive vias 14 of the base layer 1' can provide a plurality of first signal paths and a plurality of second signal paths. Accordingly, external signals received from the connecting pads 42'b can be transmitted to the control chip 2' via the first signal paths, and control signals generated by the control chip 2' can be transmitted to the light emitting elements 8' via the second signal paths. Furthermore, the inside circuit 41'a of the outermost one of the upper patterned metal layers 4'a can includes a plurality of common portions 411'a and a plurality of individual portions 412'a. In each of the pixels P, first electrodes (not shown) of the light emitting elements 8' are electrically connected to the corresponding one or two of the common portions 411'a, and second electrodes (not shown) of the light emitting elements 8' are electrically connected to the corresponding individual portions 412'a, respectively.

In addition, depending on particular implementations, at least one of the upper patterned metal layers 4'a can be formed on the base layer 1' or the adjacent upper insulating core layer 3'a by an adhesive layer AL and in a hot pressing manner. At least one of the lower patterned metal layers 4'b can be formed on the base layer 1' or the adjacent lower insulating core layer 3'b by an adhesive layer AL and in a hot pressing manner. The adhesive layer AL can be formed of a material with high adhesion to the upper insulating core layer 3'a or the lower insulating core layer 3'b, but it is not limited thereto. In the present embodiment, a portion of an adhesive layer AL located between the base layer 1' and the innermost one of the upper patterned metal layers 4'a and a portion of another adhesive layer AL located between the base layer 1' and the innermost one of the lower patterned metal layers 4'*b* are filled in the annular space AL and formed into the gap filling layer F, but the present disclosure is not limited thereto.

As shown in FIG. 36 and FIG. 37, the multi-layered circuit board Z2 can further include a first solder mask layer 7'*a* and a second solder mask layer 7'*b*. The first solder mask layer 7'*a* can be formed on the outermost one of the upper patterned metal layers 4'*a* and expose the common portions 411' *a* and the individual portions 412'*a*. The second solder mask layer 7'*b* can be formed on the outermost one of the lower patterned metal layers 4'*b* and expose the connecting pads 42'*b*.

It should be noted that, in the above-mentioned structure, the number of the connecting pads 42'*b* of the multi-layered circuit board Z2 is less than the number of the electrical contacts 221' of the control chip 2'. More specifically, if the number of the light emitting elements 8' of each pixel P is L (e.g., L=3), the number of the electrical contacts 221' would be M×N×L (4×4×3). The number of the connecting pads 42'*b* is less than M×N×L, which is for example 36.

The beneficial effect(s) of the present embodiment is that the multiple pixel package structure with the buried chip can achieve desired lighting effects required for practical applications and meet the requirements of miniaturization, by the technical features of "the pixels are arranged on the multi-layered circuit board and into an M×N array" and "the control chip is buried in the multi-layered circuit board and electrically connected to the light emitting elements of each of the pixels, so as to allow each of the pixels to produce a target luminous characteristic."

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A multiple pixel package structure with a buried chip, comprising: a multi-layered circuit board, including:
   a base layer having a first surface, a second surface opposite to the first surface, and an open groove passing through the first surface and the second surface;
   an upper patterned metal layer laminated on the first surface of the base layer through an adhesive layer, and
   a lower patterned metal layer laminated on the second surface of the base layer through another adhesive layer;
   a plurality of pixels arranged on the multi-layered circuit board and into an M×N array, wherein M and N are each an integer greater than 1; and
   a control disposed in the open groove and electrically connected to the light emitting elements of each of the pixels, so as to allow each of the pixels to produce a target luminous characteristic;
   wherein an annular space is defined by an outer peripheral surface of the control chip and an inner wall surface of the open groove, the multi-layered circuit board further includes a gap filling layer filled in the annular space and overlapping with an upper surface and a lower surface of the control chip to fix the control chip in place, and the annular space is sealed by the adhesive layer and the another adhesive layer.

2. The multiple pixel package structure according to claim 1, wherein the annular space has a width between 10 μm and 100 μm.

3. The multiple pixel package structure according to claim 2, wherein a thickness of the base layer is 0 μm to 20 μm less than a height of the control chip.

4. The multiple pixel package structure according to claim 2, wherein the control chip has an active surface that is perpendicular to the outer peripheral surface and is in proximity to the first surface of the base layer, and the active surface has a plurality of electrical contacts; and wherein the number of the light emitting elements of each of the pixels is L, and the number of the electrical contacts is M×N×L.

5. The multiple pixel package structure according to claim 4, wherein the multi-layered circuit board includes a plurality of connecting pads at a bottom thereof, and the number of the connecting pads is less than M×N×L.

6. The multiple pixel package structure according to claim 1, wherein the multi-layered circuit board further includes another upper patterned metal layer laminated on the upper patterned metal layer and another lower patterned metal layer laminated on the lower patterned metal layer, the control chip is electrically connected to the another upper patterned metal layer through the upper patterned metal layer and is electrically connected to the another lower patterned metal layer through the lower patterned metal layer; and wherein the pixels are disposed on the another upper patterned metal layer.

7. The multiple pixel package structure according to claim 6, wherein the control chip has an active surface that is in proximity to the first surface of the base layer and has a plurality of electrical contacts; wherein each of the upper patterned metal layer and the another upper patterned metal layer includes an inside circuit and an outside circuit around the inside circuit, and the light emitting elements of each of the pixels are electrically connected to the inside circuit of the another upper patterned metal layer and are electrically connected to the corresponding ones of the plurality of electrical contacts via the inside circuit of the other upper patterned metal layer; and wherein the another lower patterned metal layer defines a plurality of connecting pads, the lower patterned metal layer includes an outside circuit, a portion of the plurality of the connecting pads are electrically connected to a portion of the plurality of electrical contacts via the outside circuit of the lower patterned metal layer, and another portion of the plurality of the connecting pads are electrically connected to another portion of the plurality of electrical contacts via the outside circuit of the lower patterned metal layer and the outside circuits of the upper patterned metal layer and the another upper patterned metal layer.

8. The multiple pixel package structure according to claim 1, wherein the gap filling layer is integrated with the adhesive layer and the another adhesive layer.

9. The multiple pixel package structure according to claim 1, wherein an upper insulating core layer is formed between the upper patterned metal layer and the another upper patterned metal layer, and has a plurality of upper conductive vias for connecting the upper patterned metal layer and the another upper patterned metal layer; and wherein a lower insulating core layer is formed between the lower patterned metal layer and the another lower patterned metal layer, and has a plurality of lower conductive vias for connecting the lower patterned metal layer and the another lower patterned metal layer.

10. An electronic device characterized by using the multiple pixel package structure as claimed in claim 1.

11. The multiple pixel package structure according to claim 1, wherein each of the pixels includes a plurality of light emitting elements of different colors.

12. The multiple pixel package structure according to claim 1, further comprising a protective layer formed on the multi-layered circuit board and covering the pixels.

* * * * *